(12) United States Patent
Shibata et al.

(10) Patent No.: US 8,288,763 B2
(45) Date of Patent: Oct. 16, 2012

(54) ORGANIC ELECTROLUMINESCENCE DEVICE

(75) Inventors: Kazuyuki Shibata, Machida (JP); Kensuke Masui, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 273 days.

(21) Appl. No.: 12/633,819

(22) Filed: Dec. 9, 2009

(65) Prior Publication Data
US 2010/0140645 A1    Jun. 10, 2010

(30) Foreign Application Priority Data
Dec. 10, 2008    (JP) ................... 2008-314993

(51) Int. Cl.
*H01L 29/08* (2006.01)
(52) U.S. Cl. .................. 257/40; 313/504; 438/99
(58) Field of Classification Search ............ 257/40, 257/E51.001–E51.052; 438/99; 313/504
See application file for complete search history.

(56) References Cited

U.S. PATENT DOCUMENTS
2008/0303415 A1* 12/2008 Suzuri et al. ................. 313/504

FOREIGN PATENT DOCUMENTS
| JP | 2001-319780 A | 11/2001 |
| JP | 2002-100476 A | 4/2002 |
| JP | 2004-273128 A | 9/2004 |
| WO | WO 2006013738 A1 * | 2/2006 |

OTHER PUBLICATIONS

D'Andrade, B.W., et al. "Controlling Exciton Diffusion in Multilayer White Phosphorescent Organic Light Emitting Devices." Adv. Mater., vol. 14, No. 2 (Jan. 16, 2002): pp. 147-151.*
Holmes, R.J., et al. "Blue Organic Electrophosphorescence Using Exothermic Host-Guest Energy Transfer." Appl. Phys. Lett., vol. 82, No. 15 (Apr. 14, 2003): pp. 2422-2424.*

* cited by examiner

*Primary Examiner* — Kiesha Bryant
*Assistant Examiner* — Mark Tornow
(74) *Attorney, Agent, or Firm* — SOLARIS Intellectual Property Group, PLLC

(57) ABSTRACT

Disclosed is an organic electroluminescence device containing a pair of electrodes on a substrate, two or more luminescence layers disposed between the electrodes, and an intermediate layer containing a charge transporting material and disposed between the two or more luminescence layers, each of the two or more luminescence layers contains at least one phosphorescence material selected from a blue phosphorescence material having an emission peak from 420 nm to less than 500 nm, a green phosphorescence material having an emission peak from 500 nm to less than 570 nm, and a red phosphorescence material having an emission peak from 570 nm to 650 nm, the phosphorescence material contained in the respective luminescence layers having different emission peaks from one another; and the charge transporting material contained in the intermediate layer has an energy difference (T1) of 2.7 eV or more between a ground state and an excited triplet state and the energy difference (T1) of the charge transporting material is higher by at least 0.15 eV than T1 of a phosphorescence material having the shortest wavelength emission among the phosphorescence materials contained in the two or more luminescence layers.

5 Claims, 4 Drawing Sheets

ORGANIC ELECTROLUMINESCENCE DEVICE

CROSS-REFERENCE TO RELATED APPLICATION

This application claims priority under 35 USC 119 from Japanese Patent Application No. 2008-314993 filed on Dec. 10, 2008, the disclosure of which is incorporated by reference herein.

BACKGROUND OF THE INVENTION

1. Field of the Invention

The invention relates to an organic electroluminescence device (hereinafter also referred to as organic EL device) which may be effectively utilized as surface light sources for full color displays, backlights, illumination sources and the like, and light source arrays for printers and the like.

2. Related Art

Nowadays, various display devices have been actively researched and developed, and particularly organic EL devices can attain highly intensive light emission with low voltage and are thus attracted as promising display devices.

An organic EL device is composed of a luminescence layer or plural organic layers containing a luminescence layer, and a pair of electrodes into which an organic layer was interposed. The organic EL device is a device wherein an electron injected from a cathode and a hole injected from an anode are recombined in an organic layer, to utilize emission from an exciton formed and/or emission from another exciton molecule formed by energy transfer from the above exciton.

The organic EL device is also characterized in that luminescence of various luminescence colors is possible by mixing plural luminescence colors.

Among luminescence colors, there is particularly high need for white luminescence. White luminescence can be utilized for electrical power saving in generic illumination, in-vehicle displays, and backlights. A color filter may be used to divide white luminescence into blue, green and red pixels or to enable a full-color display.

For example, an organic EL device wherein two or more different luminescence materials are contained in a luminescence layer and at least one of the luminescence materials is an ortho-metalated complex is disclosed (see, for example, Japanese Patent Application Laid-Open (JP-A) No. 2001-319780).

However, plural luminescence materials differ in the level of exciton energy in the luminescence layer and are less liable to efficient, simultaneous emission. Moreover, the produced excitons may be quenched by diffusion to adjacent layers, thus causing a problem of reduction in efficiency.

It is disclosed that in the structure of a luminescence layer containing a host material and a blue phosphorescence material having an emission peak wavelength of 500 nm or less, a combination of the host material and the blue phosphorescence material in which the energy difference (T1) between the ground state and the excited triplet state of the host material is in the range of 1.05 times to 1.38 times based on the T1 of the blue phosphorescence material produces high emission efficiency (see, for example, JP-A No. 2002-100476). As the host material, an azole compound having a specific structure is disclosed.

A large excited triplet state energy is necessary for emitting a blue phosphorescence material, and a carbazole compound having a specific structure as a charge transporting material in a luminescence layer has such a large excited triplet state energy. Therefore, a luminescence layer containing a blue phosphorescence material and the carbazole compound is alleged to give a high-efficiency blue phosphorescence emission (see, for example, JP-A No. 2004-273128).

In the structures shown in JP-A No. 2002-100476 and JP-A No. 2004-273128, however, it is still not possible to improve inefficiency attributable to excitons leaking from a luminescence layer to its adjacent layers.

SUMMARY OF THE INVENTION

The invention has been made in view of the above circumstances and provides an organic electroluminescence device comprising a pair of electrodes on a substrate, two or more luminescence layers disposed between the electrodes, and an intermediate layer containing a charge transporting material and disposed between the two or more luminescence layers, wherein:

each of the two or more luminescence layers contains at least one phosphorescence material selected from a blue phosphorescence material having an emission peak from 420 nm to less than 500 nm, a green phosphorescence material having an emission peak from 500 nm to less than 570 nm, and a red phosphorescence material having an emission peak from 570 nm to 650 nm, the phosphorescence material contained in the respective luminescence layers having different emission peaks from one another; and the charge transporting material contained in the intermediate layer has an energy difference (T1) of 2.7 eV or more between a ground state and an excited triplet state and the energy difference (T1) of the charge transporting material is higher by at least 0.15 eV than T1 of a phosphorescence material having the shortest wavelength emission among the phosphorescence materials contained in the two or more luminescence layers.

BRIEF DESCRIPTION OF THE DRAWINGS

Exemplary embodiments of the present invention will be described in detail based on the following figures, wherein.

DETAILED DESCRIPTION OF THE INVENTION

Figure 1:
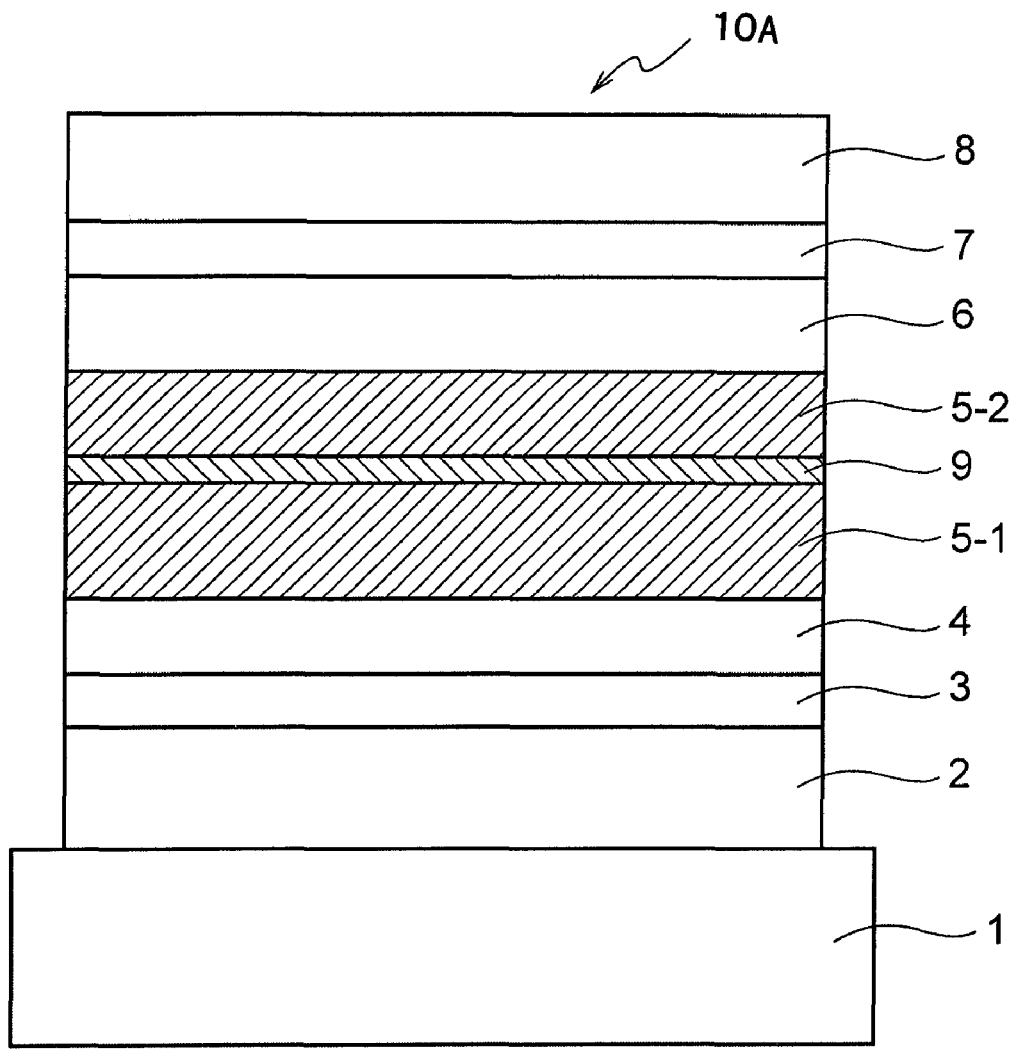
FIG. 1 is a conceptual diagram showing a sectional structure of an organic EL device of a first exemplary embodiment of the invention.

Hereinafter, an organic EL device of the invention will be described in detail. Generally, when an organic electroluminescence device for emitting white color is produced by containing phosphorescence materials corresponding to the respective colors of red (R), green (G) and blue (B) in luminescence layers, the energy of excitons transfers from the blue luminescence material wherein the lowest excited triplet state energy level (T1) is higher to the green or red luminescence material wherein T1 is lower, so that when the doping densities of the respective luminescence materials are made equal, for example, blue color is hardly generated, thus making white color emission hardly obtainable. It follows that as a means for suppressing the energy transfer of triplet excitons in the luminescence layer to obtain white color reliably, there is disclosed a white luminescence device wherein a luminescence layer is divided into two or three layers, and luminescence materials corresponding to the respective RGB colors are added separately to different luminescence layers to reliably emit the colors in the layers, respectively. For example, there is an aspect having divided luminescence layers consisting of a luminescence layer containing a blue phosphorescence material (hereinafter also referred to as "B luminescence layer") and a luminescence layer containing a green phosphorescence material and a red phosphorescence material (hereinafter also referred to as "GR luminescence layer") or an aspect having divided luminescence layers consisting of a luminescence layer containing a blue phosphorescence material, a luminescence layer containing a green phosphorescence material (hereinafter also referred to as "G luminescence layer") and a luminescence layer containing a red phosphorescence material (hereinafter also referred to as "R luminescence layer"). However, even in the case where luminescence layers are divided as described above, there arises a problem that excitons are diffused from a luminescence layer containing a phosphorescence emission having higher T1 to its adjacent luminescence layer containing a phosphorescence emission having lower T1. If the R, G and B luminescence layers are adjusted by increasing their film thickness respectively for countermeasure, there is brought about an adverse effect of deterioration in characteristics such as driving voltage, driving durability and external quantum efficiency of the device.

The inventor found that because the energy transfer of excitons from a blue luminescence material to green and red luminescence materials is thought to proceed via a charge transporting material (host material), a charge transporting material having a high value for T1 is interposed between the luminescence layers as a thin layer to enable suppression of the energy transfer of excitons, whereby a white emission organic electroluminescence device capable of reliably emitting each color in each luminescence layer and having low driving voltage, high external quantum efficiency, and high driving durability may be provided.

The organic electroluminescence device of the invention is an organic electroluminescence device containing a pair of electrodes on a substrate, two or more luminescence layers disposed between the electrodes, and an intermediate layer containing a charge transporting material and disposed between the two or more luminescence layers; each of the two or more luminescence layers contains at least one phosphorescence material selected from a blue phosphorescence material having an emission peak from 420 nm to less than 500 nm, a green phosphorescence material having an emission peak from 500 nm to less than 570 nm, and a red phosphorescence material having an emission peak from 570 nm to 650 nm, the phosphorescence materials contained in the respective luminescence layers having different emission peaks from one another; and the charge transporting material contained in the intermediate layer has an energy difference (T1) of 2.7 eV or more between a ground state and an excited triplet state and the energy difference (T1) of the charge transporting material is higher by at least 0.15 eV than T1 of a phosphorescence material having a shortest wavelength emission among the phosphorescence materials contained in the two or more luminescence layers.

In the present invention, the two or more luminescence layers contain any one of above described blue phosphorescence material, green phosphorescence material and red phosphorescence material. The blue phosphorescence material, green phosphorescence material and red phosphorescence material are not particularly limited as long as they have different emission peaks with each other. The phosphorescence material for use in the luminescence layer of the invention may be of any type and appropriately selected according to the intended use. However, in view of enhancing the suppression of the energy transfer of excitons by providing the intermediate layer as described above, and in order to provide an organic EL device which emits white light by mixing emission colors of red (R), green (G) and blue (B), preferable aspect of the phosphorescence materials and the luminescence layers are as follows.

For example, when the luminescence layers are two layers, one of the luminescence layers (a first luminescence layer) preferably contains any one of the above described phosphorescence materials selected from the group consisting of blue phosphorescence material, green phosphorescence material and red phosphorescence material and the other luminescence layer contains two phosphorescence materials which are not selected in the first luminescence layer. The three phosphorescence materials of blue, green and red may be contained in any of the luminescence layers without any restrictions of order or combination. However, when the energy transfer of excitons from blue phosphorescence material to green phosphorescence material and red phosphorescence material becomes problem as described above, the first luminescence layer preferably contains blue phosphorescence material and the other luminescence layer preferably contains green phosphorescence material and red phosphorescence material.

Alternatively, when there are three luminescence layers, it is preferable that each of three luminescence layers contains a phosphorescence material selected from the group consisting of blue phosphorescence material, green phosphorescence material and red phosphorescence material, respectively and the phosphorescence material contained in each of the luminescence layer emits different color from each other.

The organic electroluminescence device of the invention may have other functional layers as necessary. For example, the organic electroluminescence device may employ, but is not limited to, the following layer structures, and these structures may be suitably determined depending on the intended use or the like. In the following layer structures, the first luminescence layer is arranged at the side of an anode and the second luminescence layer at the side of a cathode in an aspect of (1) to (8), or the first luminescence layer is arranged at the side of an anode and the third luminescence layer at the side of a cathode in an aspect of (9) to (16); however, the first luminescence layer and the second luminescence layer according to the aspect of (1) to (8), or the first luminescence layer and the third luminescence layer according to the aspect of (9) to (16), may be laminated reversely in position.

(1) Anode/hole transporting layer/first luminescence layer/intermediate layer/second luminescence layer/electron transporting layer/cathode (2) Anode/hole transporting layer/first luminescence layer/intermediate layer/second luminescence layer/hole blocking layer/electron transporting layer/electron injecting layer/cathode (3) Anode/hole injecting layer/hole transporting layer/first luminescence layer/intermediate layer/second luminescence layer/hole blocking layer/electron transporting layer/cathode (4) Anode/hole injecting layer/hole transporting layer/first luminescence layer/intermediate layer/second luminescence layer/hole blocking layer/electron transporting layer/electron injecting layer/cathode (5) Anode/hole transporting layer/electron blocking layer/first luminescence layer/intermediate layer/second luminescence layer/electron transporting layer/cathode
(6) Anode/hole transporting layer/electron blocking layer/first luminescence layer/intermediate layer/second luminescence layer/electron transporting layer/electron injecting layer/cathode
(7) Anode/hole injecting layer/electron blocking layer/hole transporting layer/first luminescence layer/intermediate layer/second luminescence layer/electron transporting layer/cathode
(8) Anode/hole injecting layer/electron blocking layer/hole transporting layer/first luminescence layer/intermediate layer/second luminescence layer/electron transporting layer/electron injecting layer/cathode
(9) Anode/hole transporting layer/first luminescence layer/intermediate layer/second luminescence layer/intermediate layer/third luminescence layer/electron transporting layer/cathode
(10) Anode/hole transporting layer/first luminescence layer/intermediate layer/second luminescence layer/intermediate layer/third luminescence layer/hole blocking layer/electron transporting layer/electron injecting layer/cathode
(11) Anode/hole injecting layer/hole transporting layer/first luminescence layer/intermediate layer/second luminescence layer/intermediate layer/third luminescence layer/hole blocking layer/electron transporting layer/cathode
(12) Anode/hole injecting layer/hole transporting layer/first luminescence layer/intermediate layer/second luminescence layer/intermediate layer/third luminescence layer/hole blocking layer/electron transporting layer/electron injecting layer/cathode
(13) Anode/hole transporting layer/electron blocking layer/first luminescence layer/intermediate layer/second luminescence layer/intermediate layer/third luminescence layer/electron transporting layer/cathode
(14) Anode/hole transporting layer/electron blocking layer/first luminescence layer/intermediate layer/second luminescence layer/intermediate layer/third luminescence layer/electron transporting layer/electron injecting layer/cathode
(15) Anode/hole injecting layer/electron blocking layer/hole transporting layer/first luminescence layer/intermediate layer/second luminescence layer/intermediate layer/third luminescence layer/electron transporting layer/cathode
(16) Anode/hole injecting layer/electron blocking layer/hole transporting layer/first luminescence layer/intermediate layer/second luminescence layer/intermediate layer/third luminescence layer/electron transporting layer/electron injecting layer/cathode The structure of the organic electroluminescence device of the invention will be described in detail below with reference to the drawings.

FIG. 1 schematically shows a first exemplary embodiment of the structure of the organic electroluminescence device of the invention. The organic electroluminescence device 10 A in the exemplary embodiment is formed, and the organic electroluminescence device 10 A in FIG. 1 shows an aspect of two luminescence layers structure that has, on a substrate 1, a pair of oppositely placed electrodes 2 and 8 and organic layers (a hole injecting layer 3, a hole transporting layer 4, a first luminescence layer 5-1, an intermediate layer 9, a second luminescence layer 5-2, an electron transporting layer 6, and an electron injecting layer 7) placed between the electrodes 2 and 8. In the following, the structure having the anode 2 formed as a lower electrode on the substrate 1 will be described. However, the pair of electrodes 2 and 8 may be inversely formed on the substrate 1 where the order of lamination among the pair of electrodes 2 and 8 and the organic layer (hole injecting layer 3, hole transporting layer 4, first luminescence layer 5-1, intermediate layer 9, second luminescence layer 5-2, electron transporting layer 6 and electron injecting layer 7) are not change, so that the cathode 8 functions a lower electrode on the substrate 1.

The first luminescence layer 5-1 and the second luminescence layer 5-2 are layers having a function, when an electric field is applied, of receiving holes from the anode 2, the hole injecting layer 3 or the hole transporting layer 4, receiving electrons from the cathode 8, the electron injecting layer 7 or the electron transporting layer 6, and providing a location for recombination between holes and electrons so as to produce luminescence. The first luminescence layer 5-1 is a blue luminescence (B luminescence) layer and contains a blue phosphorescence material having an emission peak from 420 nm to less than 500 nm. Further, the second luminescence layer 5-2 is a green and red luminescence (G+R luminescence) layer and contains a green phosphorescence material having an emission peak from 500 nm to less than 570 nm and a red phosphorescence material having an emission peak from 570 nm to 650 nm. In the organic electroluminescence device 10A of the invention, the intermediate layer 9 is laminated to be interposed between the first luminescence layer 5-1 and the second luminescence layer 5-2. The intermediate layer 9 contains a charge transporting material having an energy difference (T1) of 2.7 eV or more between the ground state and the excited triplet state thereof and being higher by at least 0.08 eV than T1 of a phosphorescence material having the shortest wavelength among the phosphorescence materials contained in the first luminescence layer 5-1 and the second luminescence layer 5-2.

Figure 3:
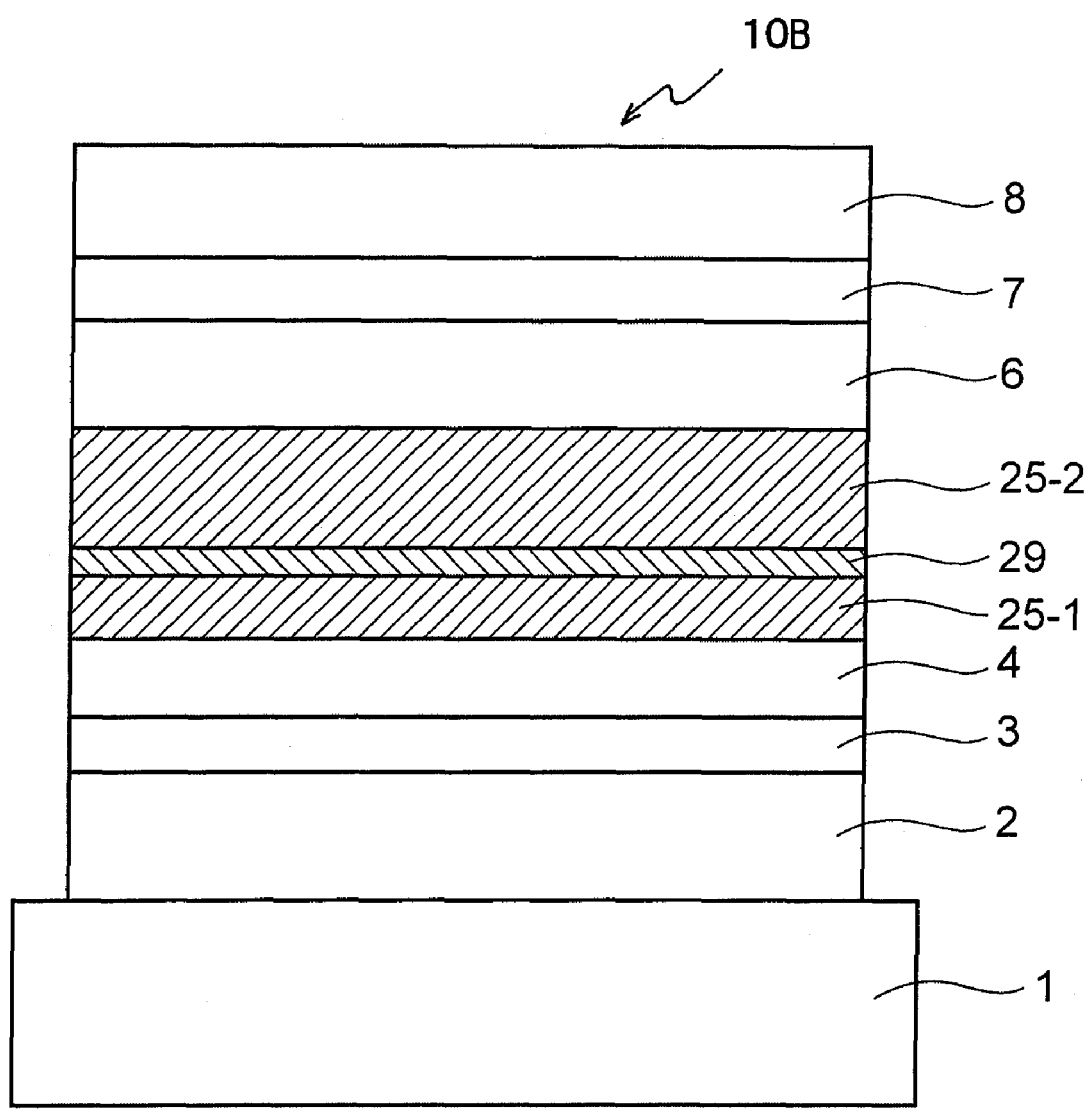
FIG. 3 is a conceptual diagram showing a sectional structure of another aspect of the organic EL device of the first exemplary embodiment of the invention.

Alternatively, the structure of the organic electroluminescence device having two luminescence layers may be such that the organic electroluminescence device 10 B shown in FIG. 3. FIG. 3 is a conceptual diagram showing a sectional structure of another aspect of the organic EL device of the first exemplary embodiment of the invention The structure of the organic electroluminescence device 10 B is such that, as shown in FIG. 3, the first luminescence layer 25-1 is a green and red luminescence layer (G+R luminescence) containing a green phosphorescence material having an emission peak from 500 nm to less than 570 nm and a red phosphorescence material having an emission peak from 570 nm to 650 nm, and the second luminescence layer 25-2 is a blue luminescence layer (B luminescence) containing a blue phosphorescence material having an emission peak from 420 nm to less than 500 nm. The organic electroluminescence device 10 B has a structure similar to that of organic electroluminescence device 10 A shown in FIG. 1 except that the constitution of the luminescence layers. An intermediate layer 29 is formed between the first luminescence layer 25-1 and the second luminescence layer 25-2.

In view of enhancing the suppression of the energy transfer of excitons by providing the intermediate layer 9, it is preferable that a first luminescence layer 5-1 is a blue luminescence layer and a second luminescence layer 5-2 is a green and red luminescence layer as shown in FIG. 1, alternatively a first luminescence layer 25-1 is a green and red luminescence layer and a second luminescence layer 25-2 is a blue luminescence layer as shown in FIG. 3. However, the invention is not limited thereto. As exemplified in FIG. 1 and FIG. 3, when luminescence layer is composed of two layers, as long as one of the two luminescence layers (a first luminescence layer) contains any one of phosphorescence material, green phosphorescence material and red phosphorescence material and the other luminescence layer contains two phosphorescence materials which are not contained in the first luminescence layer, the organic electroluminescence device is within the scope of the present invention.

Figure 2:
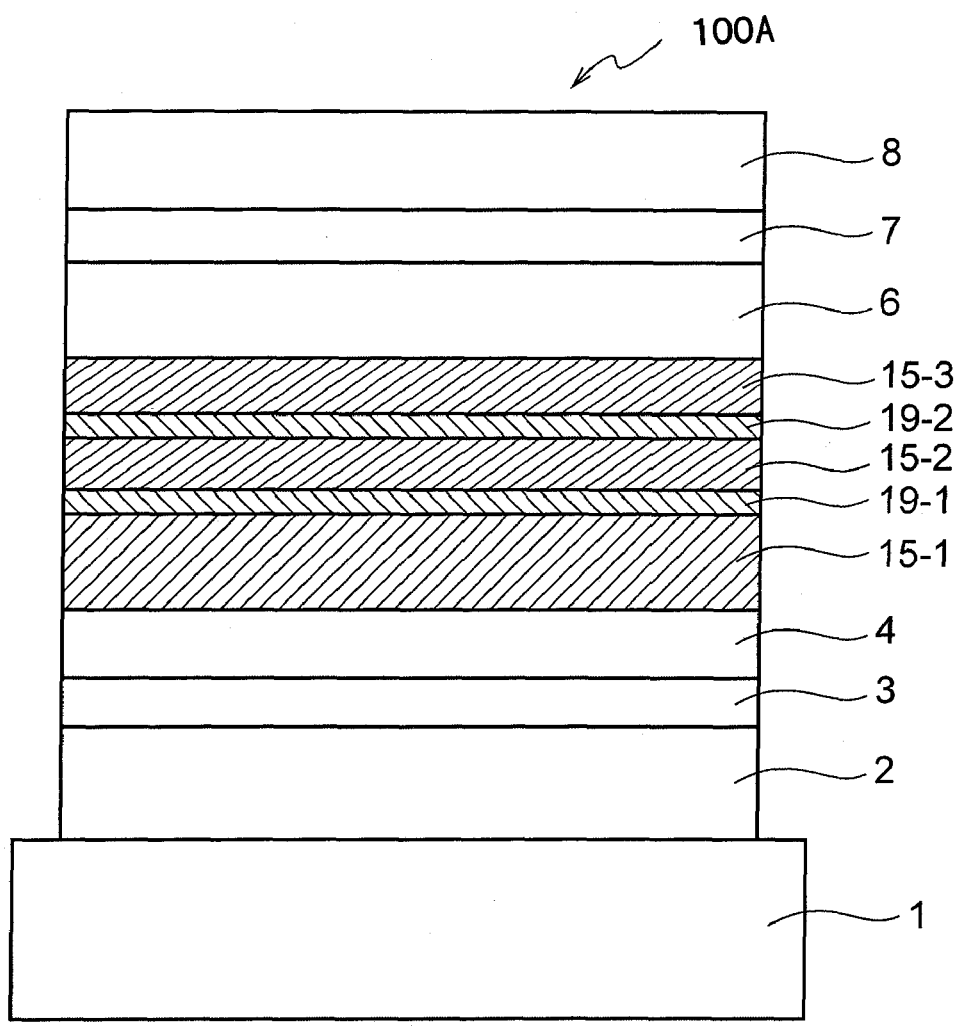
FIG. 2 is a conceptual diagram showing a sectional structure of an organic EL device of a second exemplary embodiment of the invention.

FIG. 2 is a conceptual diagram showing a sectional structure of an organic EL device of a second exemplary embodiment of the invention. The organic electroluminescence device 100 A shown in FIG. 2 is formed, and the organic electroluminescence device 100A in FIG. 3 shows an aspect of three luminescence layers structure that has a pair of oppositely placed electrodes 2 and 8, and organic layers (a hole injecting layer 3, a hole transporting layer 4, a first luminescence layer 15-1, a first intermediate layer 19-1, a second luminescence layer 15-2, a second intermediate layer 19-2, a third luminescence layer 15-3, an electron transporting layer 6, and an electron injecting layer 7) placed between the electrodes 2 and 8. In the following, the structure having the anode 2 formed as a lower electrode on the substrate 1 will be described. However, the pair of electrodes 2 and 8 may be inversely formed on the substrate 1 where the order of lamination among the pair of electrodes 2 and 8 and the organic layer (hole injecting layer 3, hole transporting layer 4, first luminescence layer 15-1, first intermediate layer 19-1, second luminescence layer 15-2, second intermediate layer 19-2, third luminescence layer 15-3, electron transporting layer 6 and electron injecting layer 7) are not change, so that the cathode 8 functions a lower electrode on the substrate 1.

In the organic electroluminescence device 100 A, the first luminescence layer 15-1 is a blue luminescence (B luminescence) layer containing a blue phosphorescence material having an emission peak from 420 nm to less than 500 nm, the second luminescence layer 15-2 is a green luminescence (G luminescence) layer containing a green phosphorescence material having an emission peak from 500 nm to less than 570 nm, the third luminescence layer 15-3 is a red luminescence (R luminescence) layer containing a red phosphorescence material having an emission peak from 570 nm to 650 nm, and the intermediate layer 19-1 is placed between the first luminescence layer 15-1 and the second luminescence layer 15-2 and the intermediate layer 19-2 is placed between the second luminescence layer 15-2 and the third luminescence layer 15-3.

Each of the intermediate layers 19-1 and 19-2 contains a charge transporting material having an energy difference (T1) of 2.7 eV or more between the ground state and the excited triplet state thereof and being higher by at least 0.08 eV than T1 of a phosphorescence material having the shortest wavelength among the phosphorescence materials contained in the first luminescence layer 15-1, the second luminescence layer 15-2 and the third luminescence layer 15-3.

Figure 4:
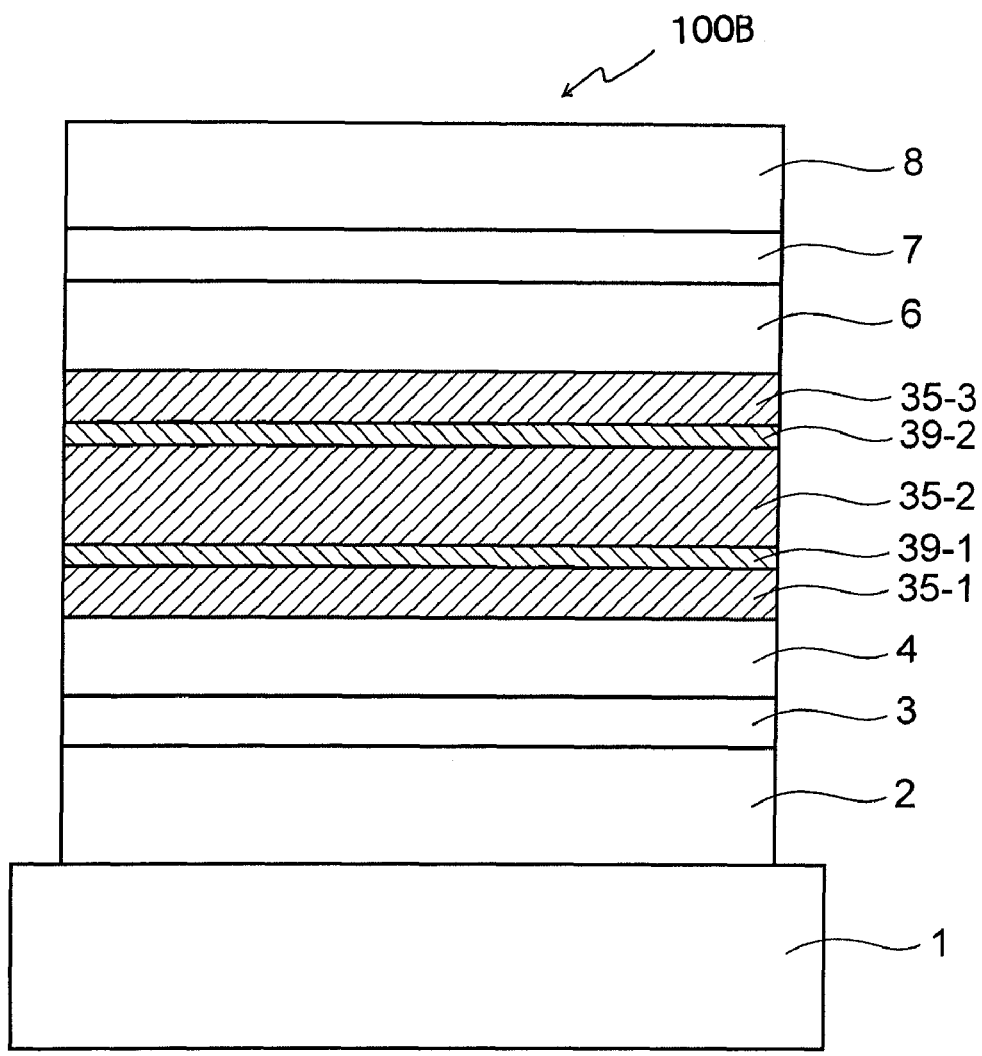
FIG. 4 is a conceptual diagram showing a sectional structure of another aspect of the organic EL device of the second exemplary embodiment of the invention.

The structure of the luminescence layers having three layers may be such that, as shown in FIG. 4. FIG. 4 is a conceptual diagram showing a sectional structure of another aspect of the organic EL device of the second exemplary embodiment of the invention. In the organic electroluminescence device 100B shown in FIG. 4, the first luminescence layer 35-1 is a green luminescence layer (G luminescence) containing a green phosphorescence material having an emission peak from 500 nm to less than 570 nm, the second luminescence layer 35-2 is a blue luminescence layer (B luminescence) containing a blue phosphorescence material having an emission peak from 420 nm to less than 500 nm, and the third luminescence layer 35-3 is a red luminescence layer (R luminescence) containing a red phosphorescence material having an emission peak from 570 nm to 650 nm. The organic electroluminescence device 100 B has a structure similar to that of organic electroluminescence device 100A shown in FIG. 2 except that the constitution of the luminescence layers. A first intermediate layer 39-1 is formed between the first luminescence layer 35-1 and the second luminescence layer 35-2, and a second intermediate layer 39-2 is formed between the second luminescence layer 35-2 and the third luminescence layer 35-3.

In an alternative structure (not shown), the first luminescence layer 35-1 may be a red luminescence layer (R luminescence) containing a red phosphorescence material having an emission peak from 570 nm to 650 nm, the second luminescence layer 35-2 may be a blue luminescence layer (B luminescence) containing a blue phosphorescence material having an emission peak from 420 nm to less than 500 nm, and the third luminescence layer 35-3 may be a green luminescence layer (G luminescence) containing a green phosphorescence material having an emission peak from 500 nm to less than 570 nm.

When the organic electroluminescence device contains three luminescence layers, with respect to blue luminescence layer (B luminescence), red luminescence layer (R luminescence) and green luminescence layer (G luminescence), the order to be placed is not particularly limited.

In any of the structures shown in FIGS. 1 to 4, the energy transfer of excitons from the blue phosphorescence material to the green and red phosphorescence materials is suppressed by the intermediate layer containing a charge transporting material having high T1, and as a result, each color is reliably emitted in each of the luminescence layers, thereby decreasing driving voltage, increasing external quantum efficiency and improving drive durability.

The components that constitute the organic EL device of the invention will be described in detail below.
(Luminescence Layer)

In the organic electroluminescence device of the invention, the luminescence layer is composed of at least two layers as described above. The luminescence layer contains at least one phosphorescence material. The luminescence layer can function as luminescence layer due to the action of the phosphorescence material.

The phosphorescence material used in the luminescence layer in the invention includes, for example, complexes containing transition metal atoms or lanthanoid atoms.

The transition metal atoms are not particularly limited, and preferable examples thereof include ruthenium, rhodium, palladium, tungsten, rhenium, osmium, iridium and platinum, and more preferably rhenium, iridium and platinum.

Examples of the lanthanoid atoms include lanthanum, cerium, praseodymium, neodymium, samarium, europium, gadolinium, terbium, dysprosium, holmium, erbium, thulium, ytterbium, and lutetium. Among these lanthanoid atoms, neodymium, europium, and gadolinium are preferred.

Examples of ligands of complexes include those ligands described in, for example, "Comprehensive Coordination Chemistry", written by G Wilkinson, et al., published from Pergamon Press in 1987, "Photochemistry and Photophysics of Coordination Compounds" written by H. Yersin, published from Springer-Verlag Co. in 1987, and "Organic Metal Chemistry—Foundation and Application—" written by Akio Yamamoto, published from Shokabo Co. in 1982.

Specifically, examples of ligands are preferably halogen ligands (preferably, chlorine ligand), nitrogen-containing heterocyclic ligands (for example, phenylpyridine, benzoquinoline, quinolinol, bipyridyl, and phenanthroline), diketone ligands (for example, acetylacetone), carboxylic acid ligands (for example, acetic acid ligand), carbon monoxide ligand, isonitrile ligand, and cyano ligand, more preferably nitrogen-containing heterocyclic ligands. The complexes described above may have one transition metal atom in the compound or may be a so-called dinuclear complexes having two or more of transition metal atoms. Metal atoms of different kinds may be contained together.

Among these compounds, specific examples of the luminescence material include, for example, phosphorescence materials described in patent documents such as U.S. Pat. Nos. 6,303,238 B1, 6,097,147, WO 00/57676, WO 00/70655, WO 01/08230, WO 01/39234A2, WO 01/41512A1, WO 02/02714A2, WO 02/15645A1, WO 02/44189A1, JP-A Nos. 2001-247859, 2002-302671, 2002-117978, 2002-225352, 2002-235076, 2003-123982, 2002-170684, EP No. 1,211, 257, JP-A Nos. 2002-226495, 2002-234894, 2001-247859, 2001-298470, 2002-173674, 2002-203678, 2002-203679, 2004-357791, 2006-256999, and 2007-19462.

As the phosphorescence materials in the invention, an electron transporting luminescence material or a hole transporting luminescence material may be used.

<Electron Transporting Phosphorescence Material>

The electron transporting phosphorescence material is preferably an electron transporting phosphorescence material having an electron affinity (Ea) of 2.5 to 3.5 eV and an ionization potential (Ip) of 5.7 to 7.0 eV.

The materials that may be preferably used include complexes of ruthenium, rhodium, palladium, tungsten, rhenium, osmium, iridium, platinum, lanthanum, cerium, praseodymium, neodymium, samarium, europium, gadolinium, terbium, dysprosium, holmium, erbium, thulium, ytterbium, and lutetium. The material is more preferably ruthenium, rhodium, palladium, or platinum complexes, most preferably a platinum complex. Specific examples of the platinum complex are shown below; however, the platinum complex is not limited thereto:

Compound (1)

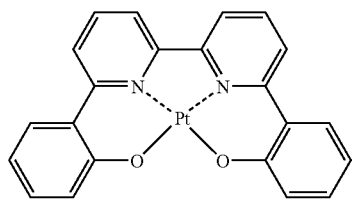

Compound (2)

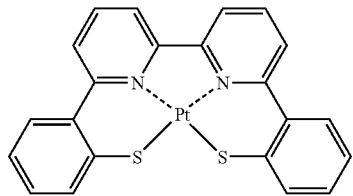

Compound (3)

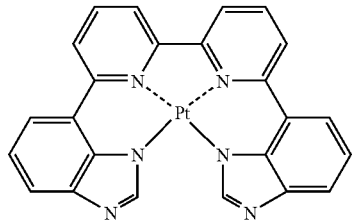

Compound (4)

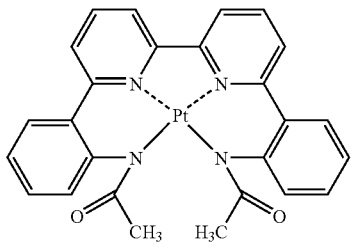

Compound (5)

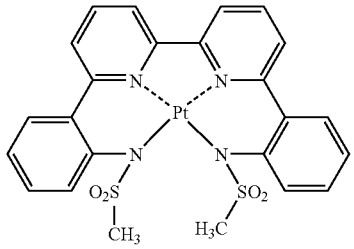

Compound (6)

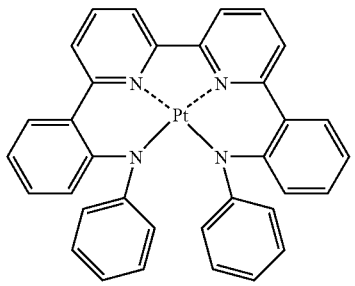

Compound (12)

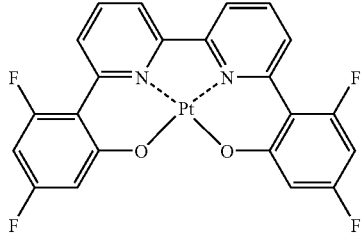

Compound (7)

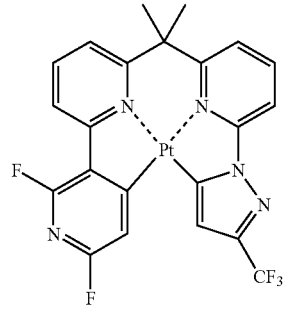

Compound (8)

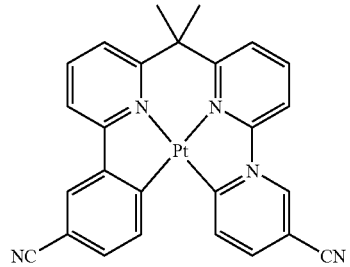

Compound (13)
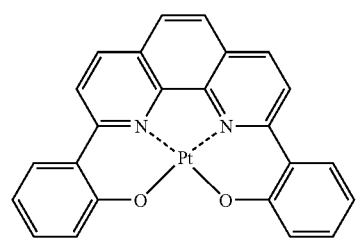
Compound (14)
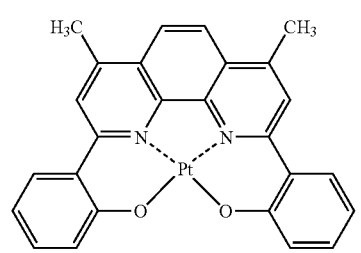
Compound (15)
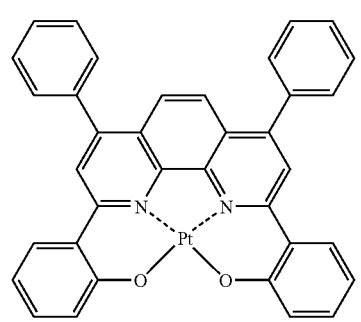
Compound (16)
Compound (17)
Compound (18)
Compound (19)
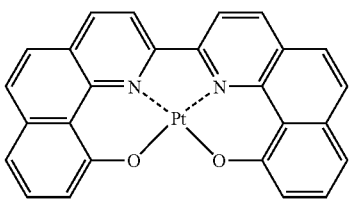
Compound (20)
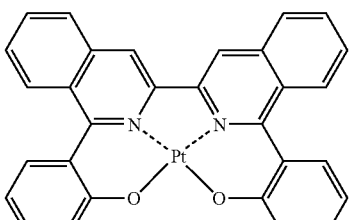
Compound (21)
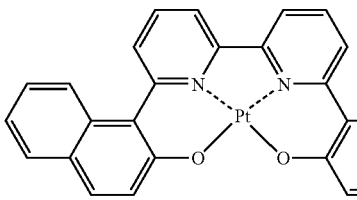
Compound (22)
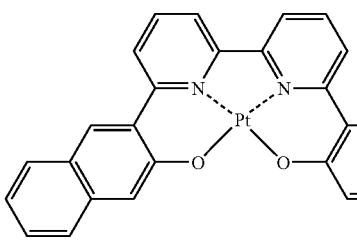
Compound (23)
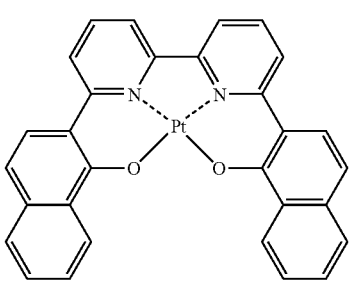
Compound (24)
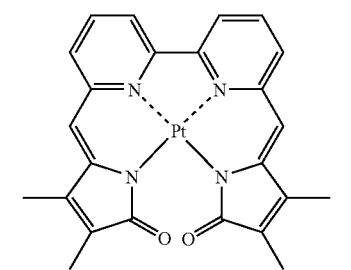

Compound (25)
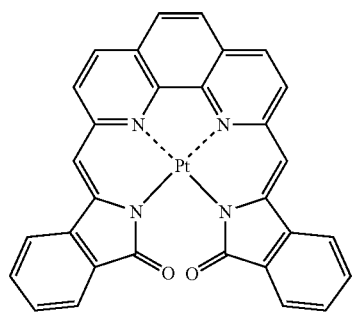
Compound (26)
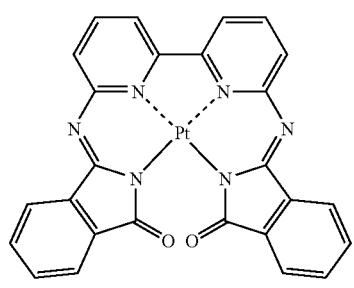
Compound (27)
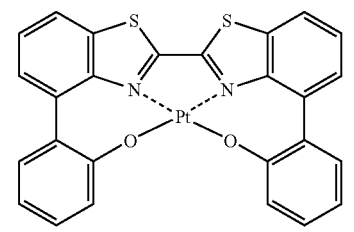
Compound (28)
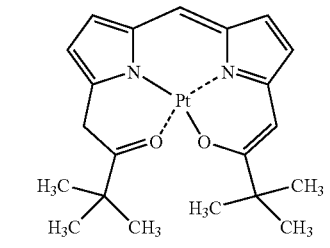
Compound (29)
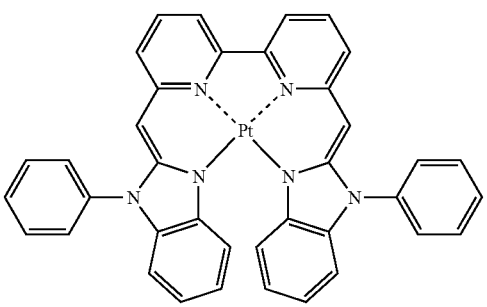
Compound (30)
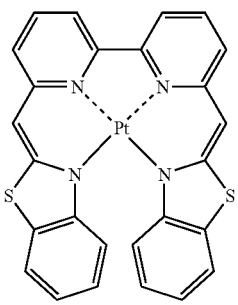
Compound (31)
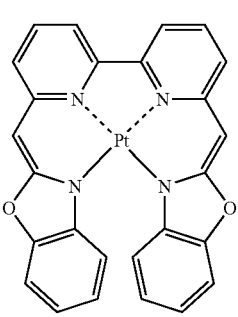
Compound (32)
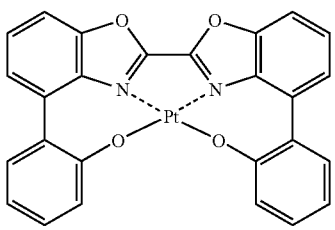
Compound (33)
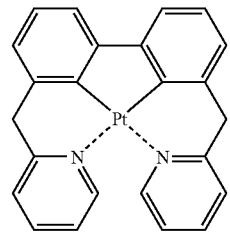
Compound (34)
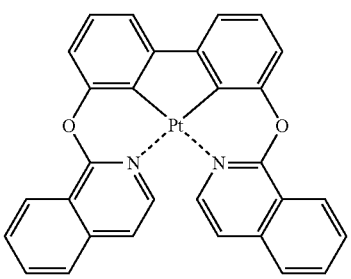

Compound (35)
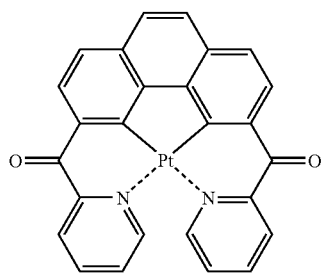
Compound (36)
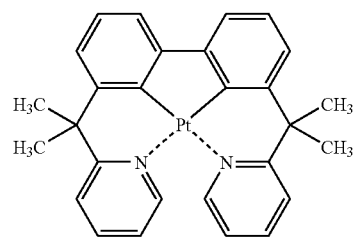
Compound (37)
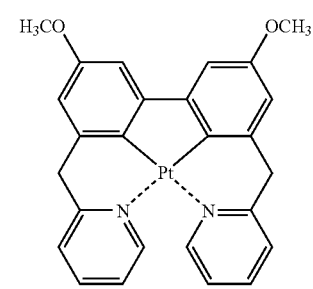
Compound (38)
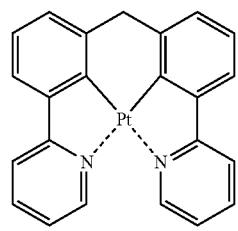
Compound (39)
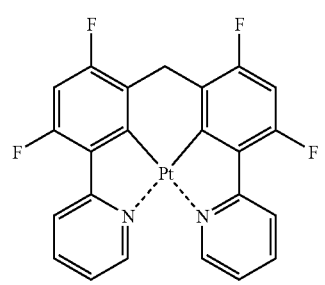
Compound (40)
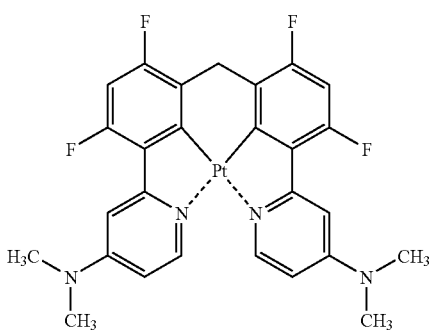
Compound (41)
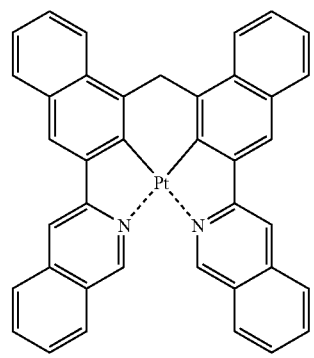
Compound (42)
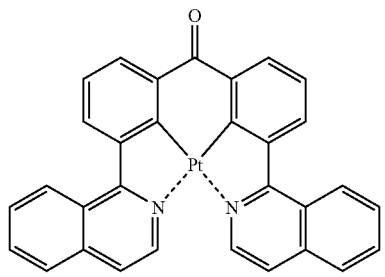
Compound (43)
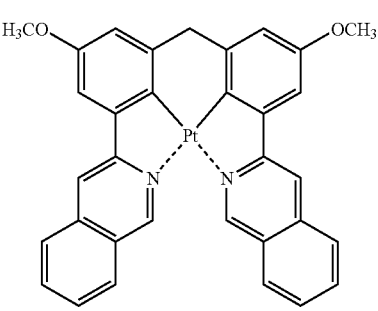
Compound (44)
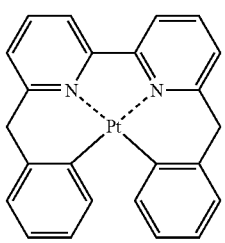

Compound (45)
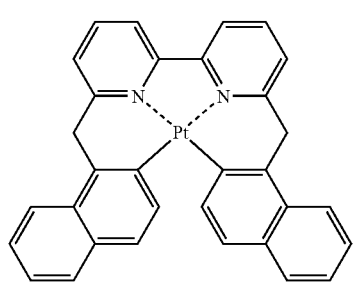
Compound (46)
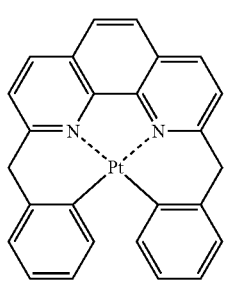
Compound (47)
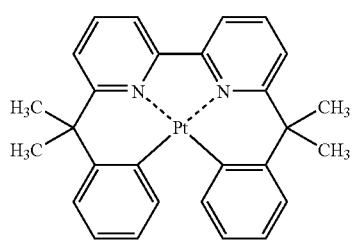
Compound (48)
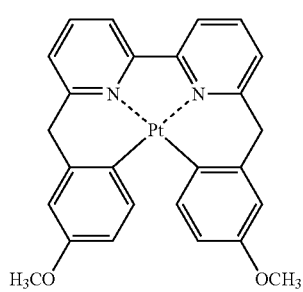
Compound (49)
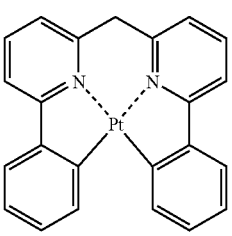
Compound (50)
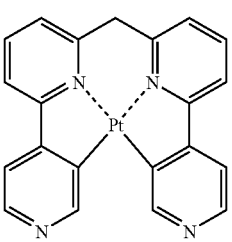
Compound (51)
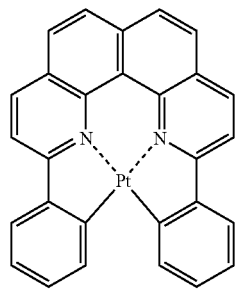
Compound (52)
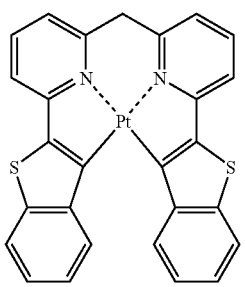
Compound (53)
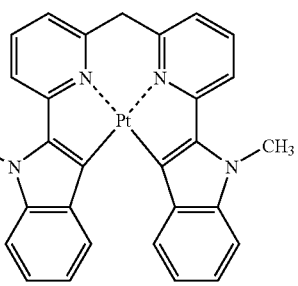
Compound (54)
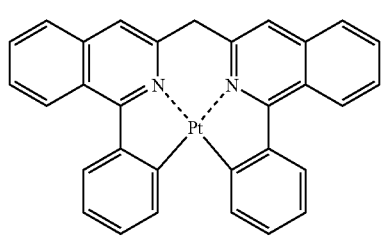
Compound (55)
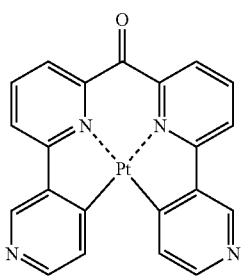

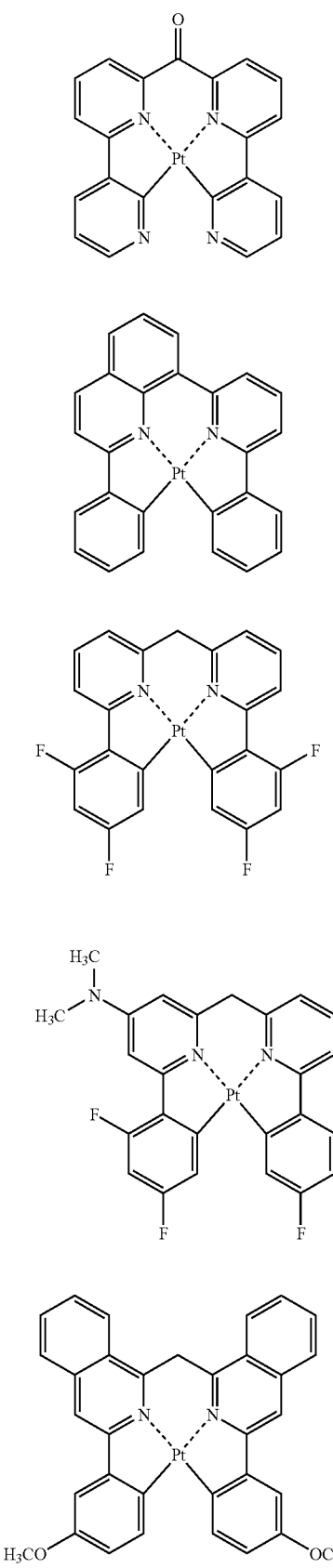

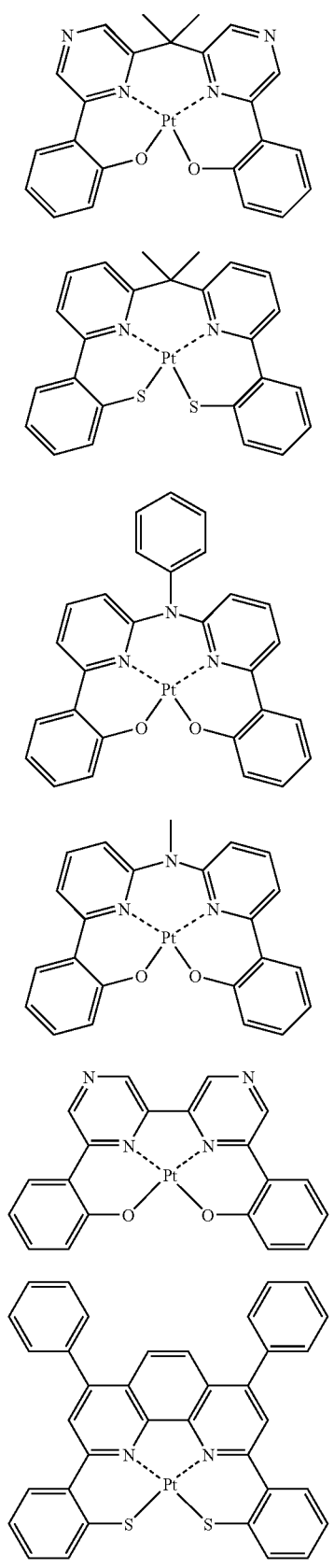
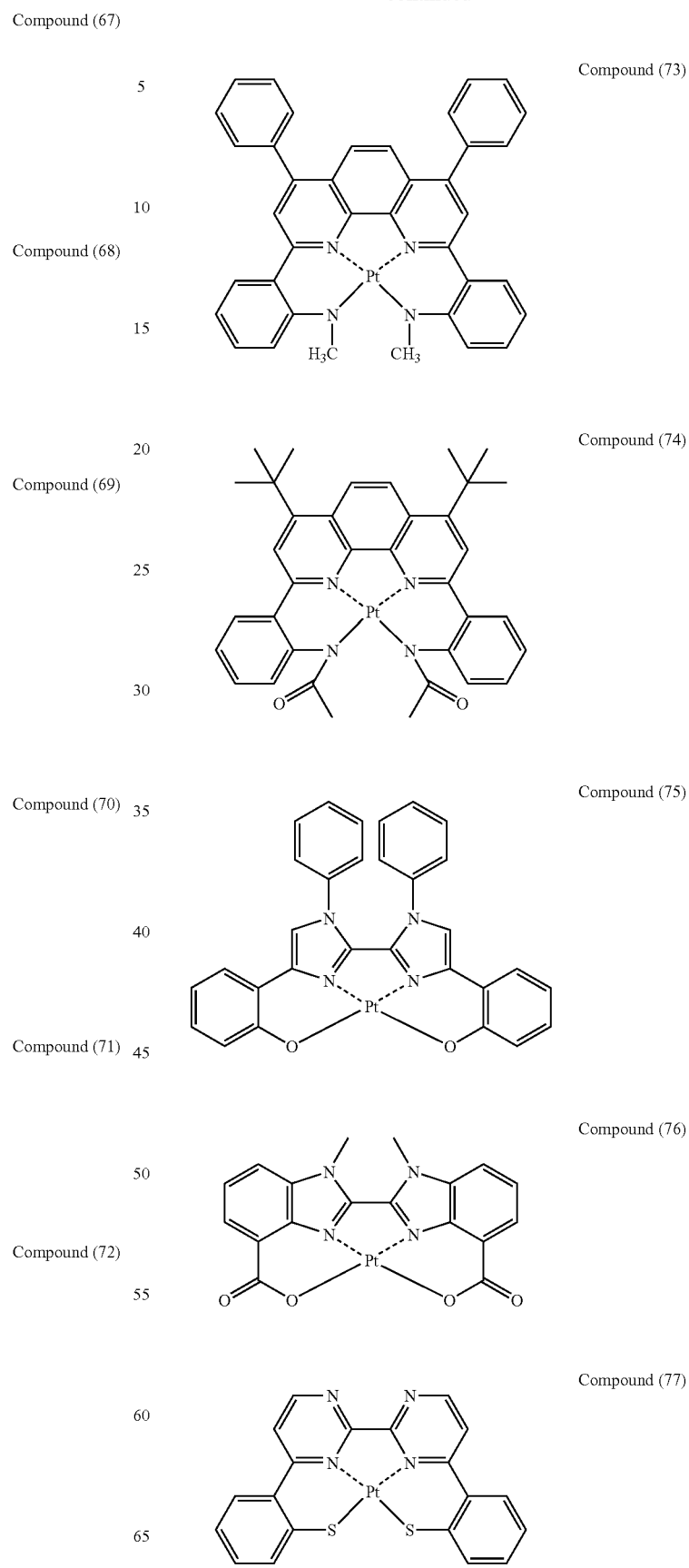

Compound (78)
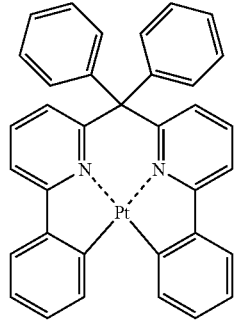
Compound (79)
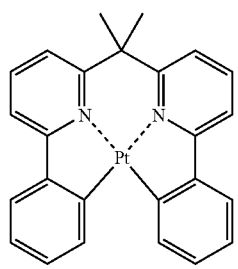
Compound (80)
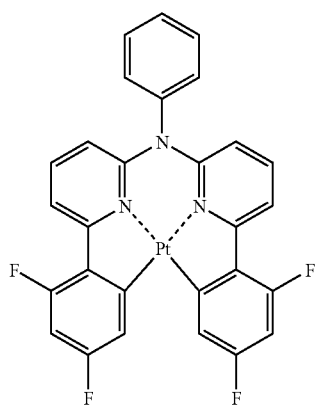
Compound (81)
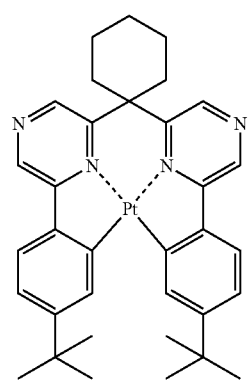
Compound (82)
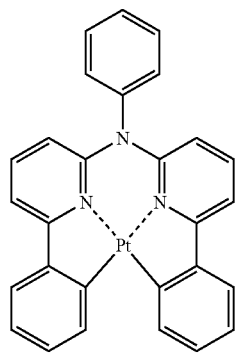
Compound (83)
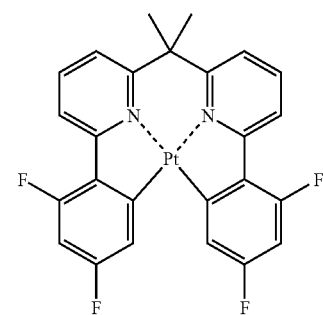
Compound (84)
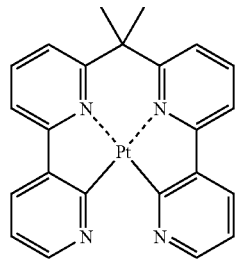
Compound (85)
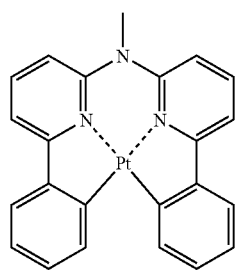
Compound (86)
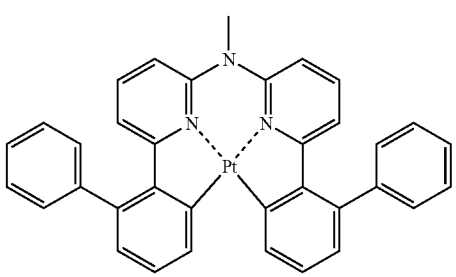

Compound (87)
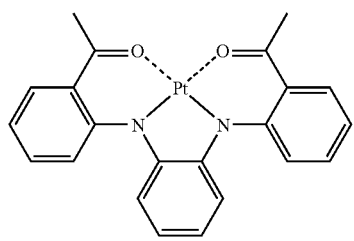
Compound (88)
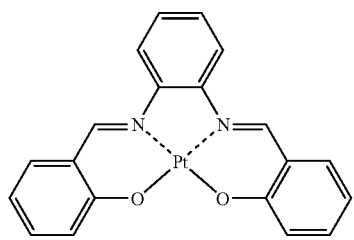
Compound (89)
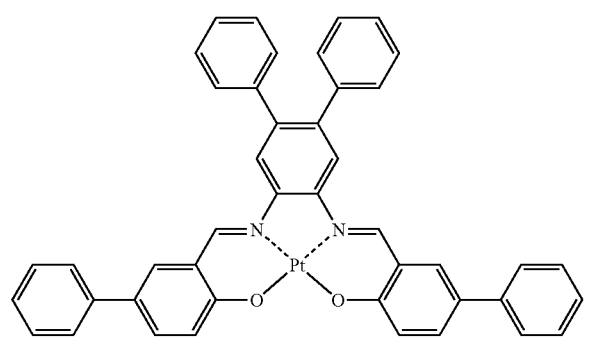
Compound (90)
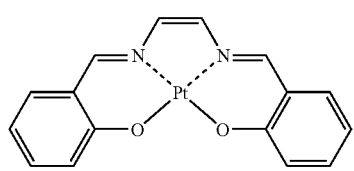
Compound (91)
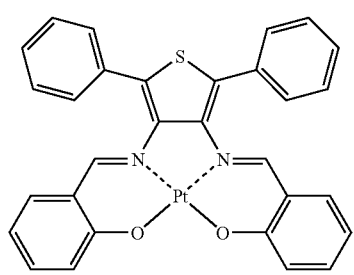
Compound (92)
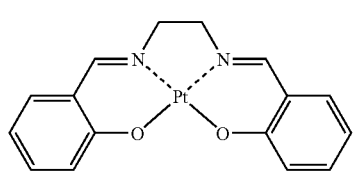
Compound (93)
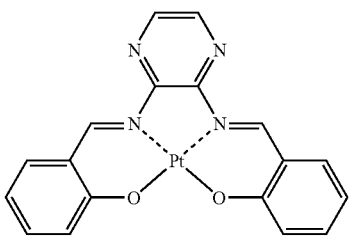
Compound (94)
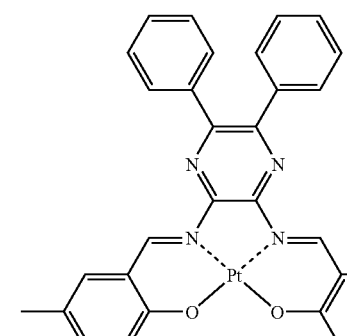
Compound (95)
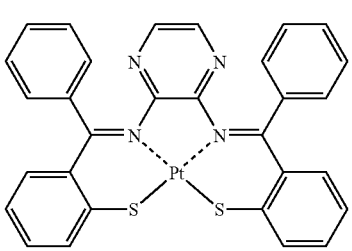
Compound (96)
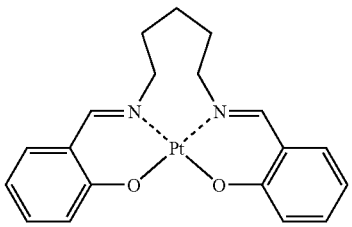
Compound (97)
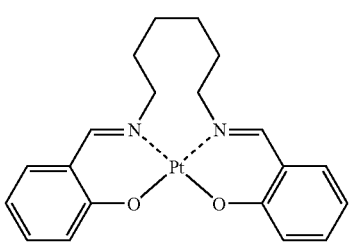
Compound (98)
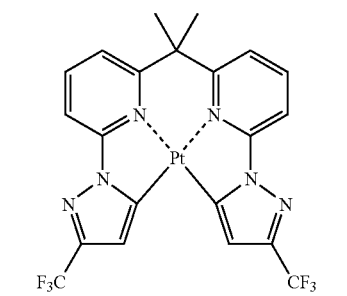

Compound (99)

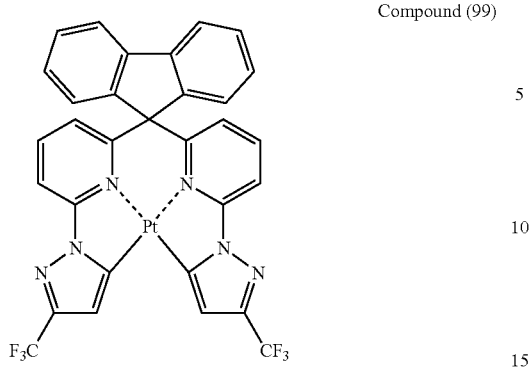

<Hole Transporting Phosphorescence Material>

As the phosphorescence material in the invention, a hole transporting phosphorescence material may be used.

The hole transporting phosphorescence material is preferably a hole transporting phosphorescence material having an electron affinity (Ea) of 2.4 to 3.4 eV and an ionization potential (Ip) of 5.0 to 6.3 eV.

The materials that may be preferably used include complexes of ruthenium, rhodium, palladium, tungsten, rhenium, osmium, iridium, platinum, lanthanum, cerium, praseodymium, neodymium, samarium, europium, gadolinium, terbium, dysprosium, holmium, erbium, thulium, ytterbium and lutetium. The material is more preferably an iridium complex.

Specific examples of the iridium complex are shown below; however, the iridium complex is not limited thereto:

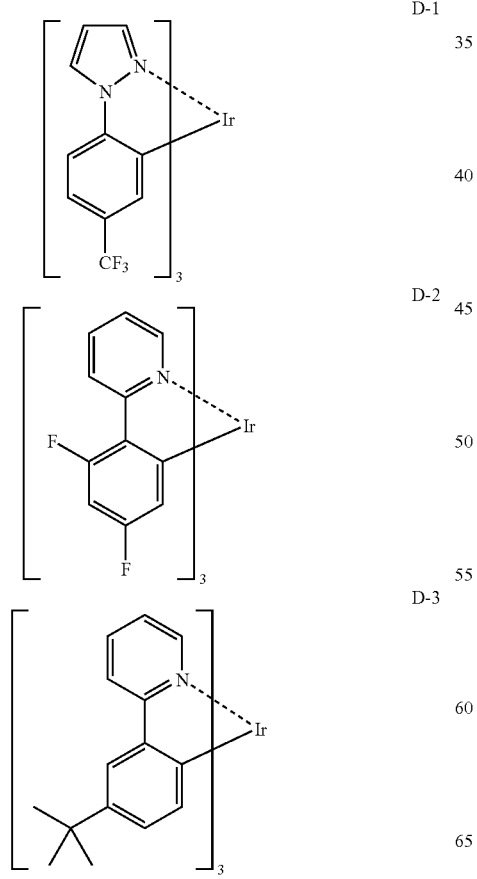

D-1

D-2

D-3

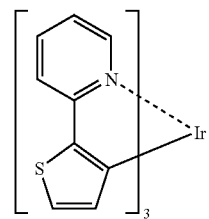

D-4

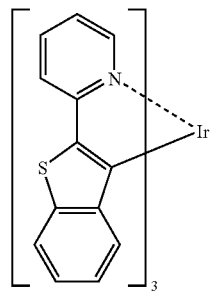

D-5

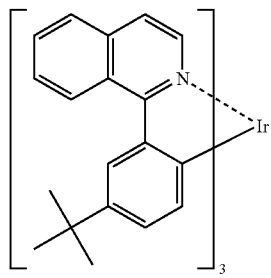

D-6

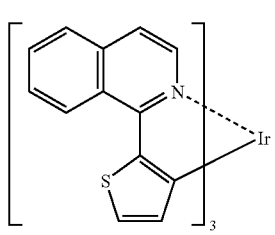

D-7

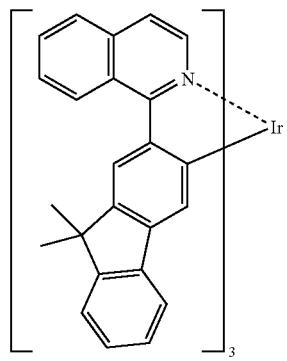

D-8

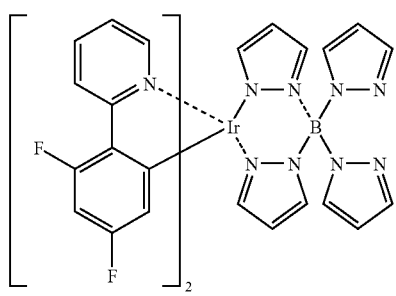
D-9
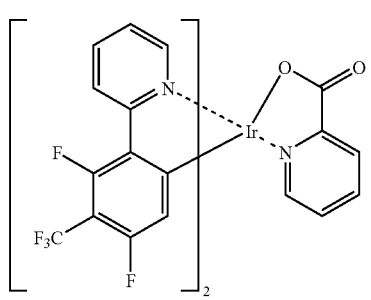
D-10
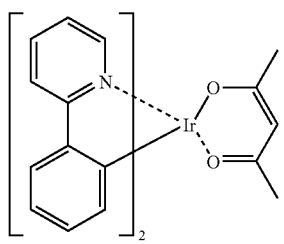
D-11
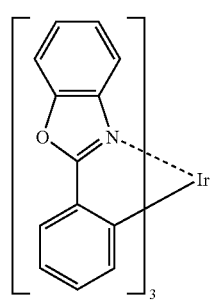
D-12
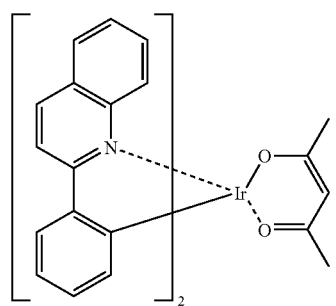
D-13
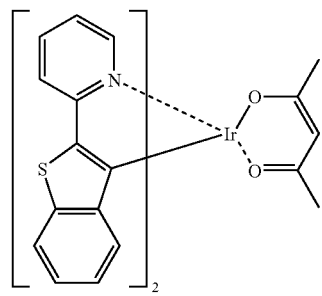
D-14
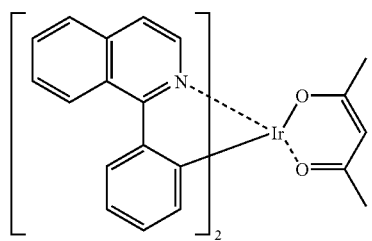
D-15
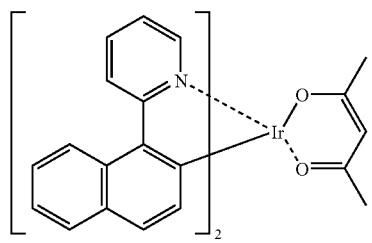
D-16
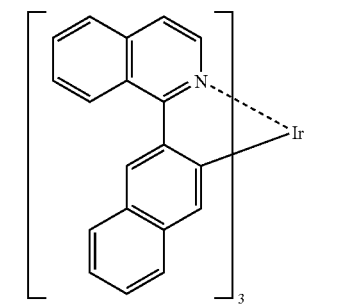
D-18
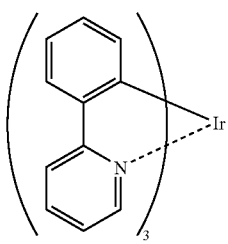
D-19
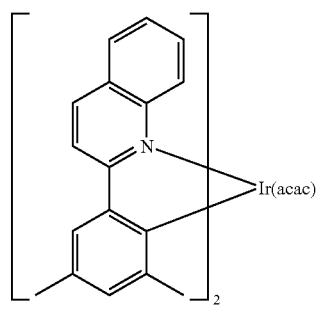

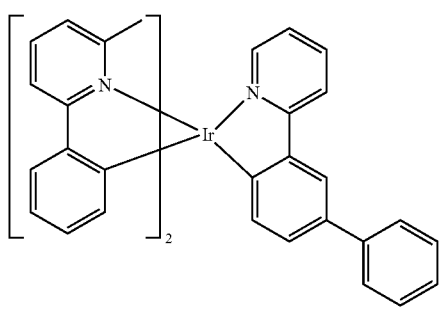
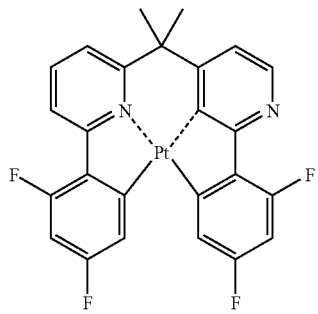
B-3
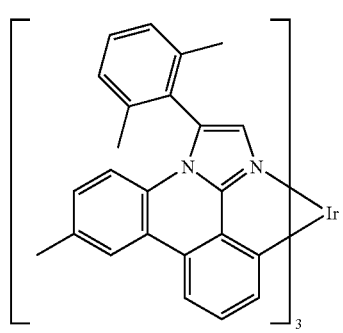
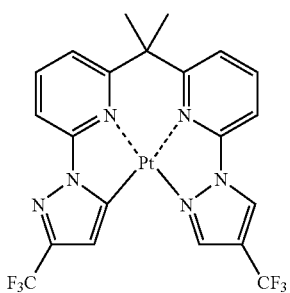
B-1
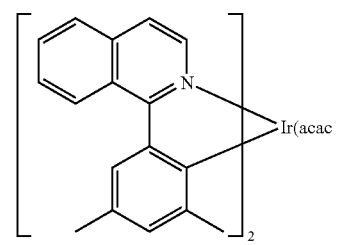
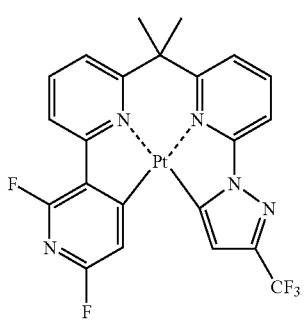
B-2
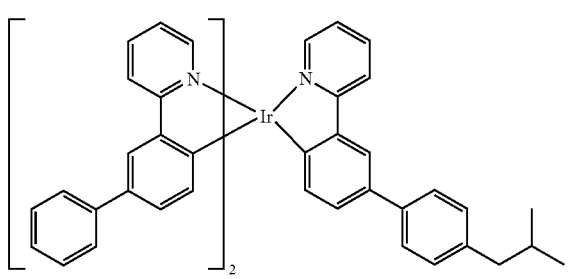
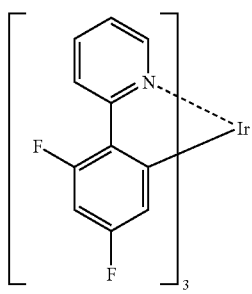
B-4
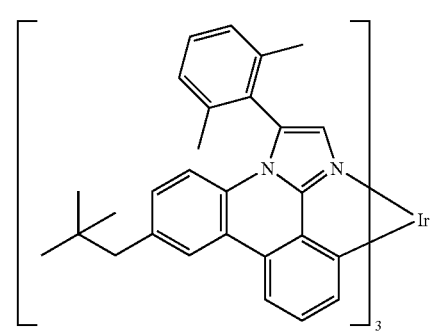
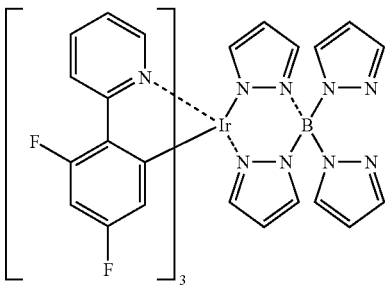
B-5
Among these examples, the blue phosphorescence materials having an emission peak from 420 nm to less than 500 nm include, but are not limited to, the followings:

-continued
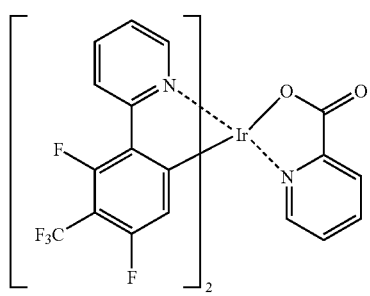
B-6
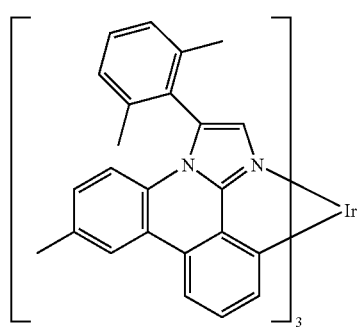
B-7
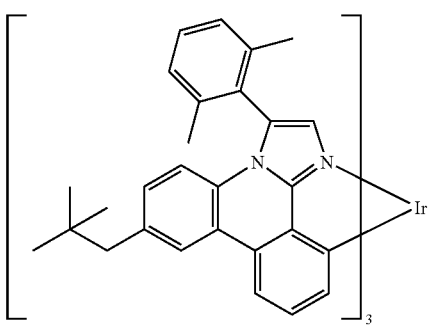
B-8
The green phosphorescence materials having an emission peak from 500 nm to less than 570 nm include, but are not limited to, the followings:
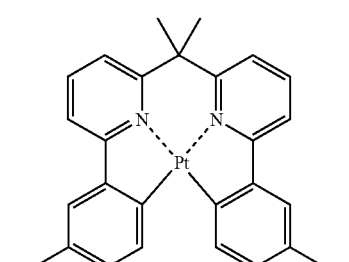
G-1
-continued
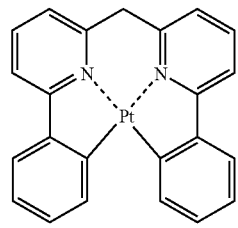
G-3
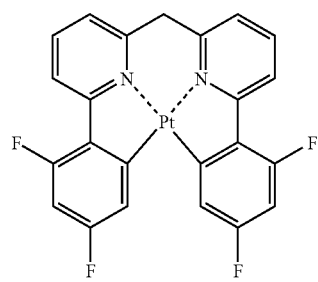
G-4
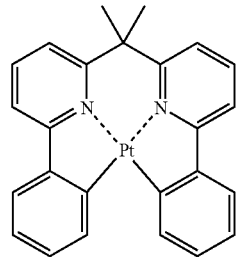
G-5
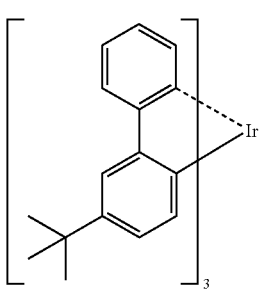
G-6
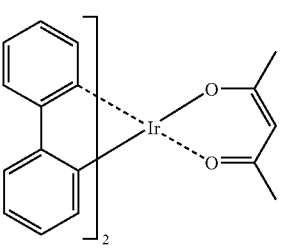
G-7
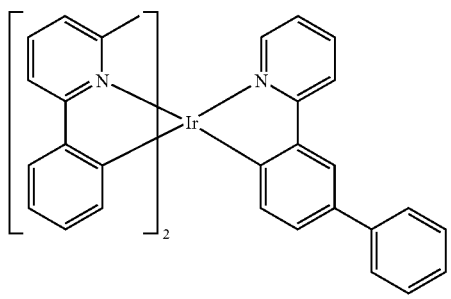
G-8
G-2

G-9

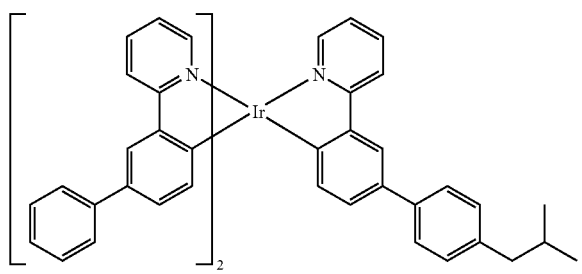

The red phosphorescence materials having an emission peak from 570 nm to 650 nm include, but are not limited to, the followings:

R-1

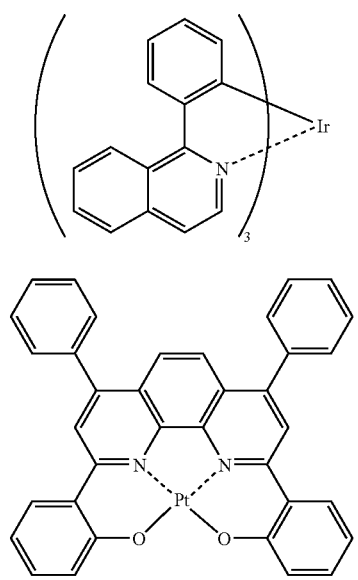

R-2

R-3

R-4

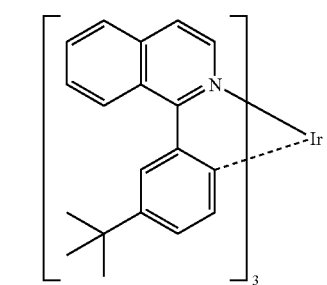

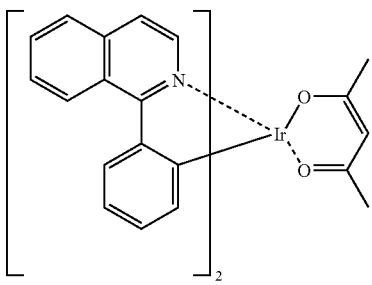

R-5

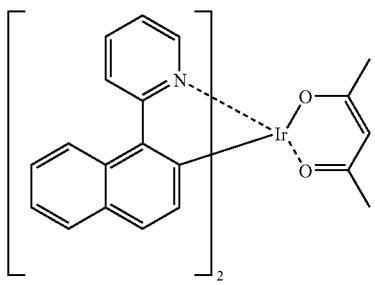

R-6

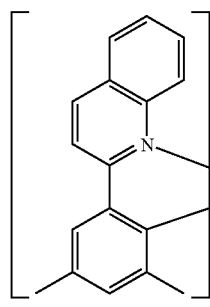

R-7

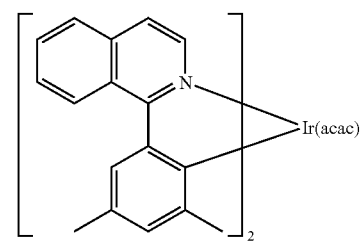

(Host Material)

The luminescence layer in the invention preferably contains a host material.

The host material refers to a compound mainly participating in injecting and transporting charges in the luminescence layer and not substantially emitting light by itself. The phrase "not substantially emitting light" herein means that the amount of light emitted from the compound not substantially emitting light is preferably 5% or less, more preferably 3% or less, still more preferably 1% or less based on the total emission of the whole device.

When the phosphorescence material in the invention is electron-transporting, the host material is preferably a hole transporting material, while when the phosphorescence material in the invention is hole-transporting, then the host material is preferably an electron transporting material.

<Hole Transporting Host Material>

The hole transporting host material used in the luminescence layer of the invention has an ionization potential (Ip) of 5.1 to 6.4 eV, more preferably 5.4 to 6.2 eV, even more preferably 5.6 to 6.0 eV, from the viewpoint of durability improvement and drive voltage reduction. From the viewpoint of durability improvement and drive voltage reduction, the electron affinity (Ea) is preferably 1.2 to 3.1 eV, more preferably 1.4 to 3.0 eV, even more preferably 1.8 to 2.8 eV.

The lowest triplet excitation level (hereinafter referred to as T1) is preferably 2.2 to 3.7 eV, more preferably 2.4 to 3.7 eV, most preferably 2.4 to 3.4 eV.

Specific examples of the hole transporting host material include electroconductive high-molecular-weight oligomers, organic silane, carbon films and derivatives thereof, such as pyrrole, indole, carbazole, azaindole, azacarbazole, pyrazole, imidazole, polyarylalkane, pyrazoline, pyrazolone, phenylene diamine, aryl amine, amino-substituted chalcone, styryl anthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers, thiophene oligomers, and polythiophene.

Among them, indole derivatives, carbazole derivatives, azaindole derivatives, azacarbazole derivatives, aromatic tertiary amine compounds, and thiophene derivatives are preferable, and those having, in a molecule, plural indole skeletons, carbazole skeletons, azaindole skeletons, azacarbazole skeletons or aromatic tertiary amine skeletons are more preferable.

The hole transporting host material in the invention is particularly preferably a carbazole derivative.

In the invention, a host material having hydrogens substituted partially or wholly by deuteriums may be used (see, for example, Japanese Patent Application No. 2008-126130 and Japanese Patent Application National Publication (Laid-Open) No. 2004-515506).

Examples of specific compounds of the hole transporting host material include, but are not limited to, the followings:

H-1

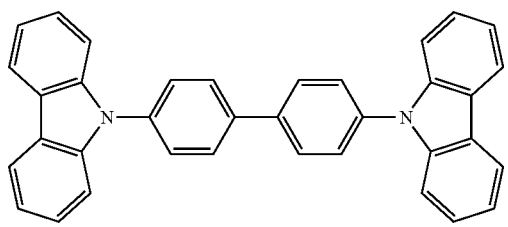

H-2

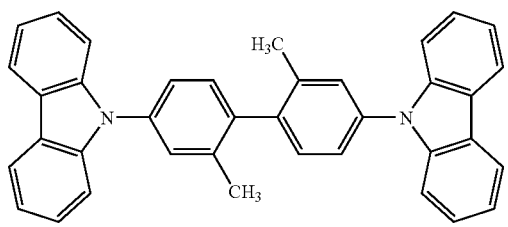

H-3

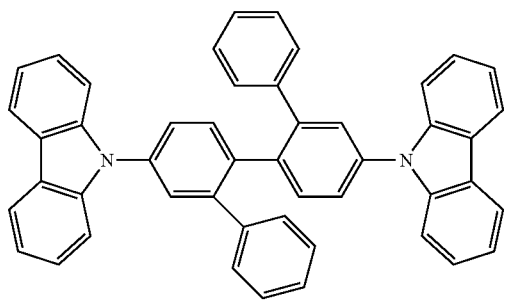

H-4

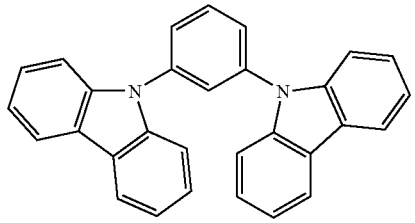

H-5

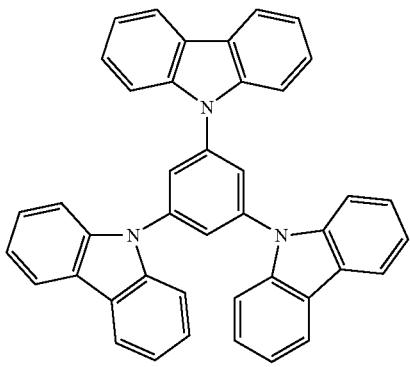

H-6

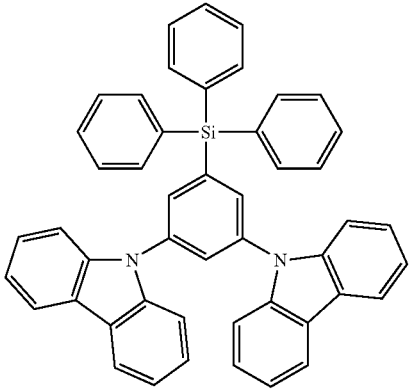

H-7

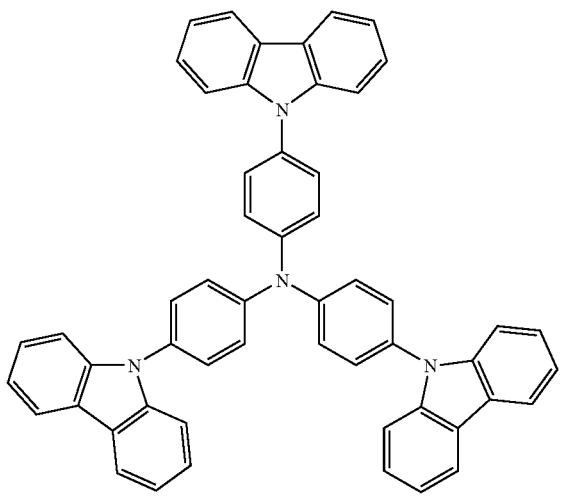

H-8
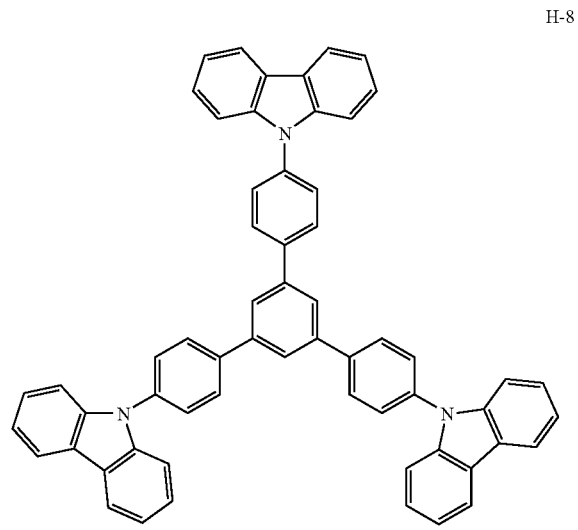
H-9
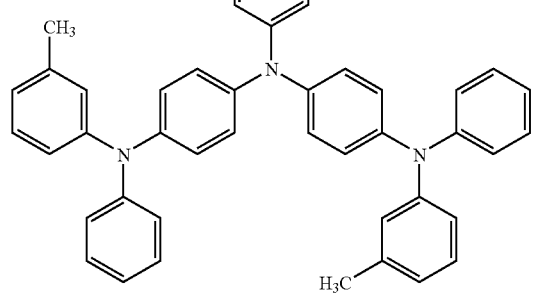
H-10
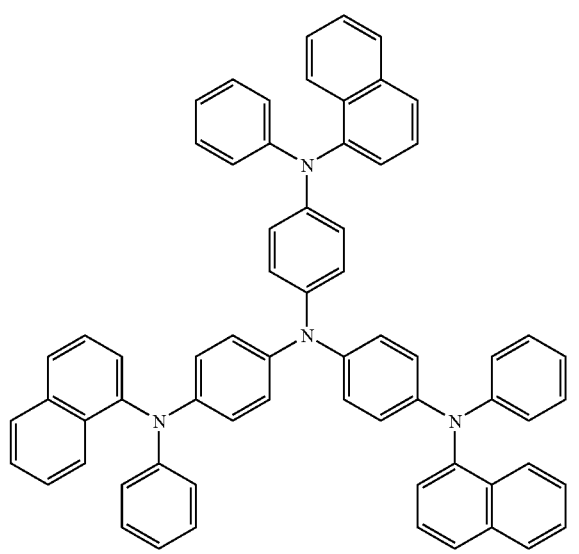
H-11
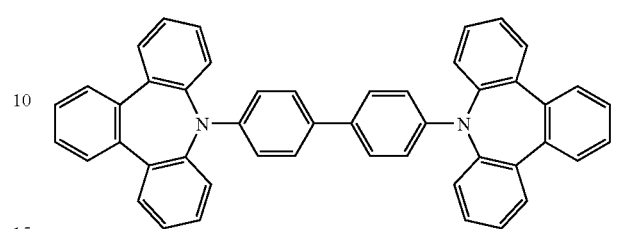
H-12
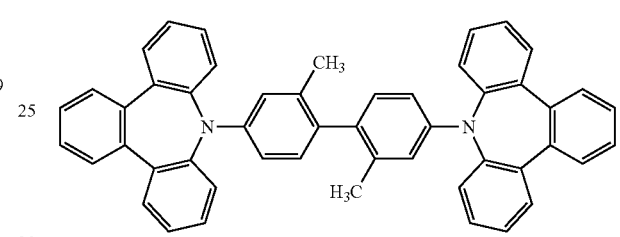
H-13
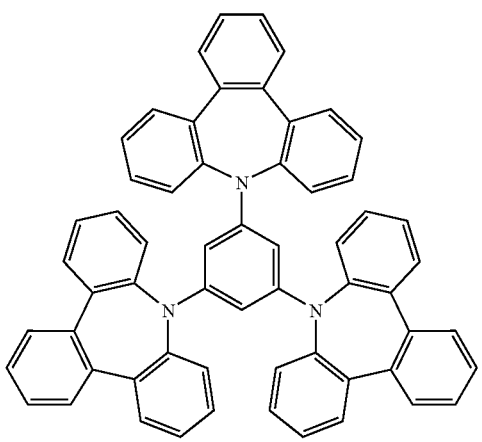
H-14

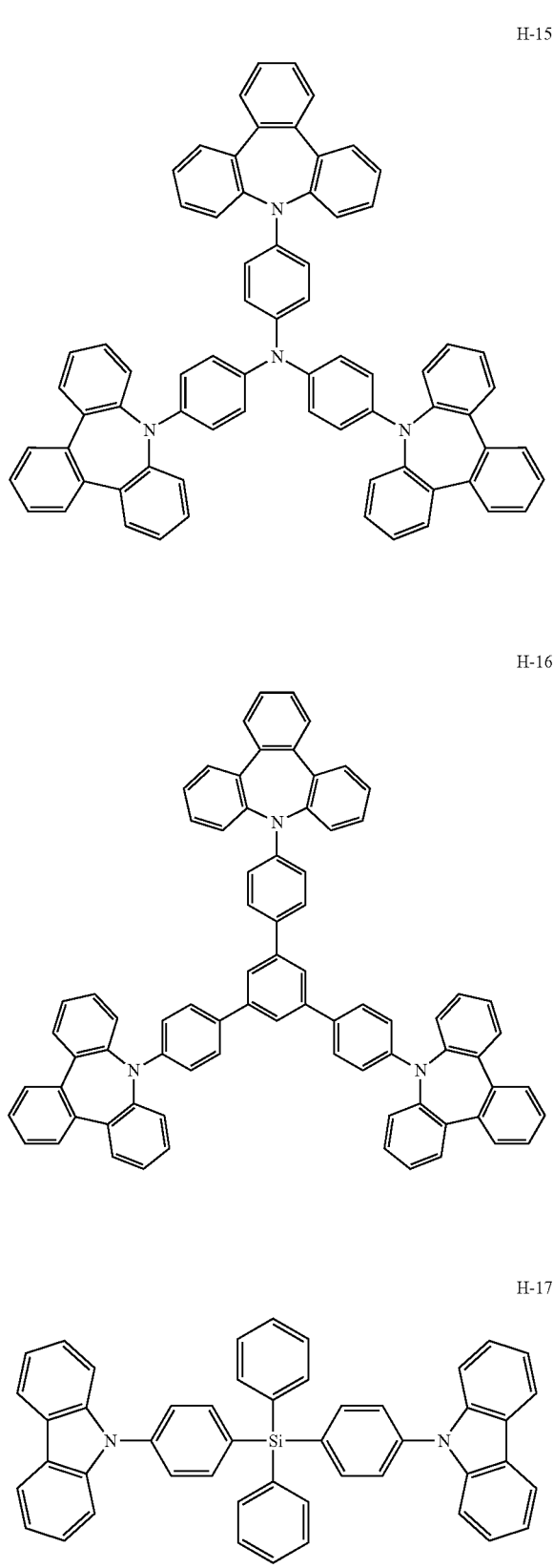
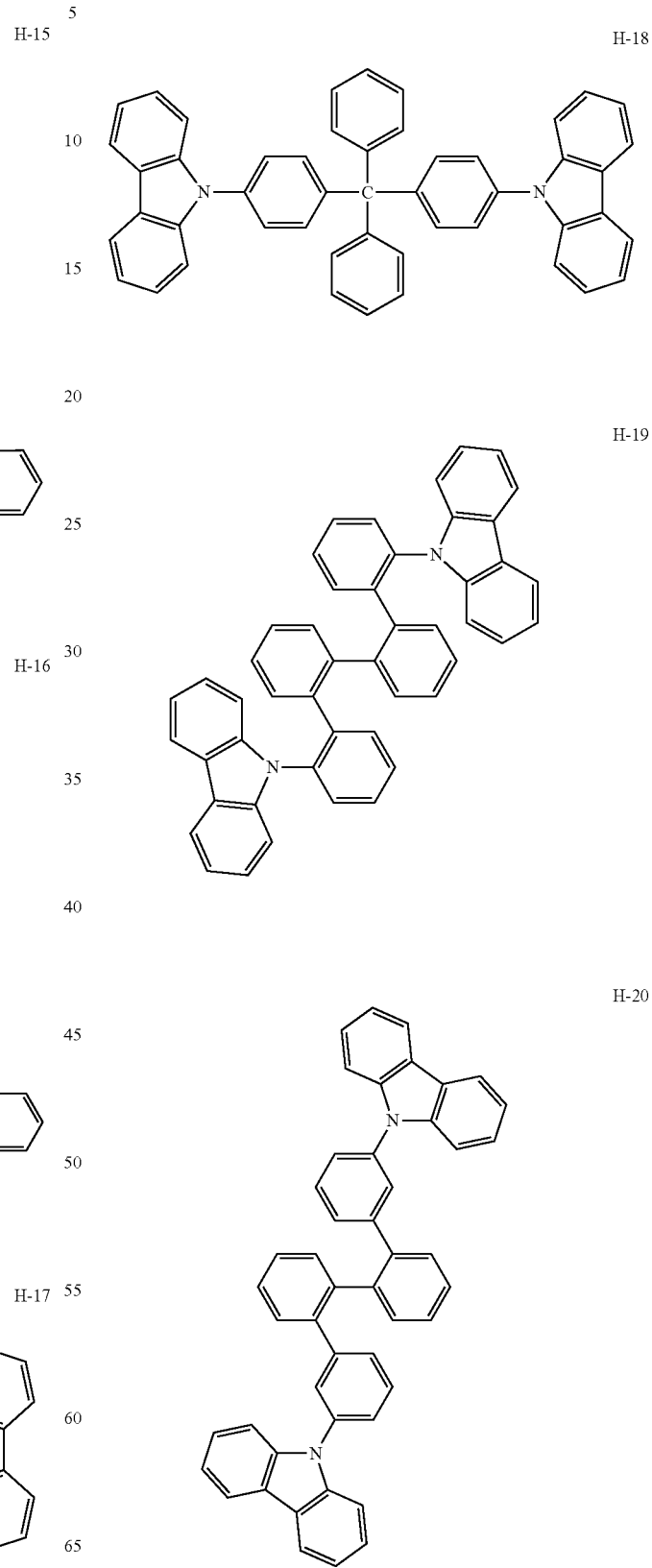

H-21
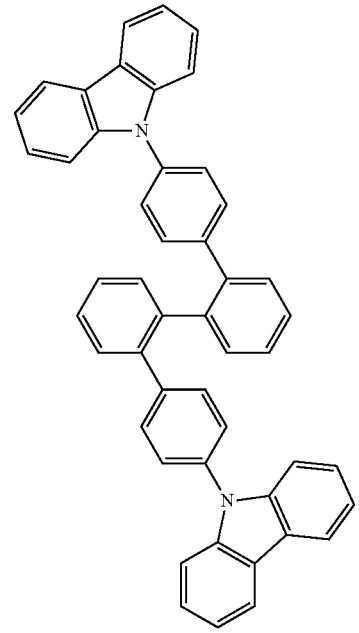
H-22
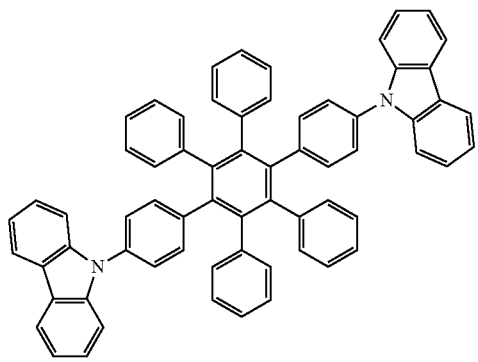
H-23
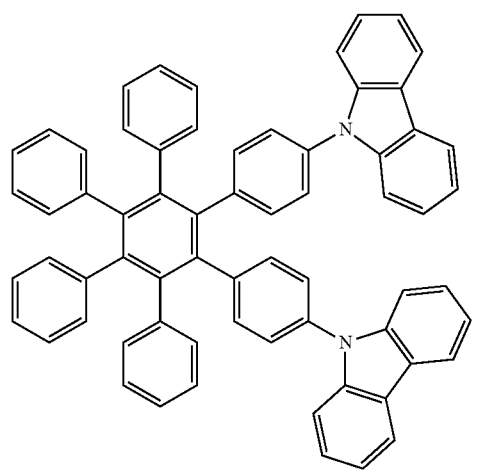
H-24
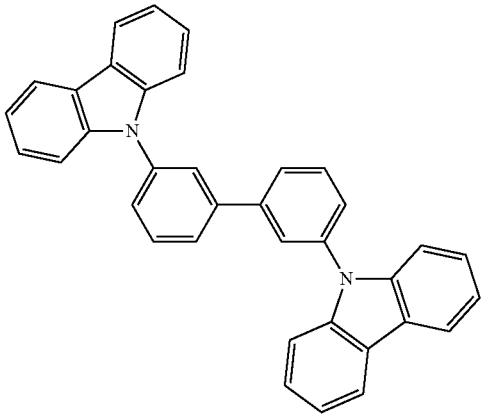
H-25
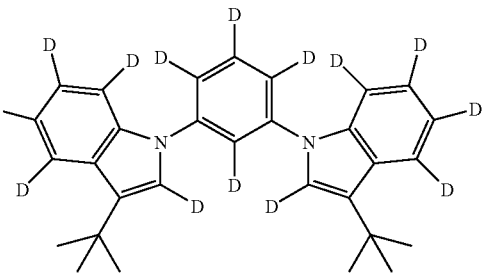
H-26
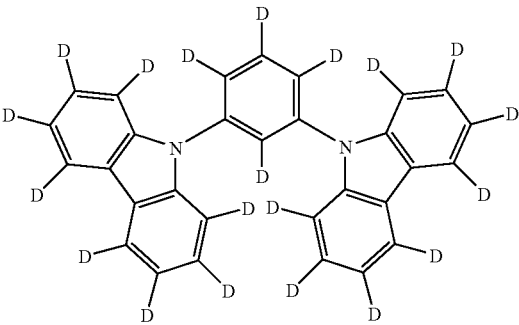
H-27
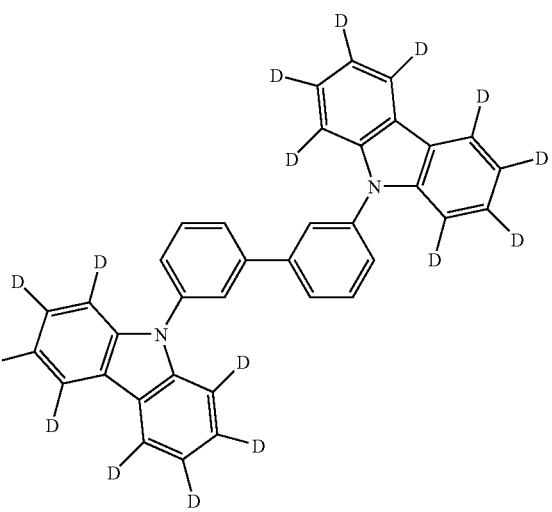

-continued

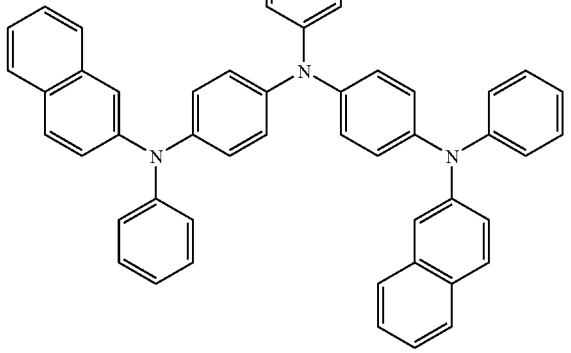

H-28

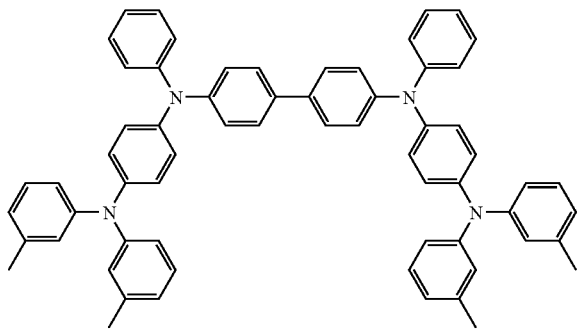

H-29

<Electron Transporting Host Material>

The electron transporting host material used in the invention has an electron affinity (Ea) of preferably 2.5 to 3.5 eV, more preferably 2.6 to 3.4 eV, even more preferably 2.8 to 3.3 eV, from the viewpoint of durability improvement and drive voltage reduction. From the viewpoint of durability improvement and drive voltage reduction, the ionization potential (Ip) is preferably 5.7 to 7.5 eV, more preferably 5.8 to 7.0 eV, even more preferably 5.9 to 6.5 eV.

The lowest triplet excitation level (T1) is preferably 2.2 to 3.7 eV, more preferably 2.4 to 3.7 eV, most preferably 2.4 to 3.4 eV.

Specifically, examples of the electron transferring host material include pyridine, pyrimidine, triazine, imidazole, pyrazole, triazole, oxazole, oxadiazole, fluorenone, anthraquinodimethane, anthron, diphenylquinone, thiopyrane dioxide, carbodiimide, fluorenylidene methane, distyrylpyradine, fluorine-substituted aromatic compounds, aromatic tetracarboxylic anhydrides such as naphthalene and perylene, phthalocyanine, and other derivatives (which may form condensed rings with other rings), and various metal complexes such as metal complexes of 8-quinolinole derivatives, and metal complex having metal phthalocyanine, benzoxazole, or benzothiazole as the ligand.

The electron transporting host material is preferably a metal complex, an azole derivative (a benzimidazole derivative, an imidazopyrimidine derivative or the like), an azine derivative (a pyridine derivative, a pyrimidine derivative, a triazine derivative or the like), among which a metal complex compound is preferable in the invention from the viewpoint of durability. The metal complex compound is more preferably a metal complex having a ligand having at least one nitrogen atom or oxygen atom or sulfur atom coordinated with a metal.

The metal ion in the metal complex is not particularly limited, but is preferably a beryllium ion, a magnesium ion, an aluminum ion, a gallium ion, a zinc ion, an indium ion, a tin ion, a platinum ion, or a palladium ion, more preferably a beryllium ion, an aluminum ion, a gallium ion, a zinc ion, a platinum ion, or a palladium ion, still more preferably an aluminum ion, a zinc ion, a platinum ion, or a palladium ion.

Ligands contained in the metal complexes include various known ligands, such as those described in "Photochemistry and Photophysics of Coordination Compounds" written by H. Yersin, published from Springer-Verlag Co. in 1987, and "Organic Metal Chemistry—Foundation and Application—" written by Akio Yamamoto, published from Shokabo Co. in 1982, etc.

The ligand is preferably a nitrogen-containing heterocyclic ligand (preferably having 1 to 30 carbon atoms, more preferably 2 to 20 carbon atoms, and still more preferably 3 to 15 carbon atoms and being a monodentate ligand or a ligand with two sites or more, preferably a bidentate to hexadentate ligand, also preferably a mixture of a bidentate to hexadentate ligand and a monovalent ligand).

Examples of the ligand include an azine ligand (for example, a pyridine ligand, a bipyridyl ligand, a terpyridine ligand, etc.), a hydroxyphenylazole ligand (for example, a hydroxyphyenylbenzimidazole ligand, a hydroxyphenylbenzoxazole ligand, a hydroxyphenylimidazole ligand, a hydroxyphenylimidazopyridine ligand, etc.), an alkoxy ligand (preferably having 1 to 30 carbon atoms, more preferably 1 to 20 carbon atoms, even more preferably 1 to 10 carbon atoms, for example, methoxy, ethoxy, butoxy, 2-ethylhexyloxy, etc.), an aryloxy ligand (preferably having 6 to 30 carbon atoms, more preferably 6 to 20 carbon atoms, even more preferably 6 to 12 carbon atoms, for example, phenyloxy, 1-naphthyloxy, 2-naphthyloxy, 2,4,6-trimethylphenyloxy, 4-biphenyloxy, etc.), a heteroaryloxy ligand (preferably having 1 to 30 carbon atoms, more preferably 1 to 20 carbon atoms, even more preferably 1 to 12 carbon atoms, for example, pyridyloxy, pyrazyloxy, pyrimidyloxy, quinolyloxy, etc.), an alkylthio ligand (preferably having 1 to 30 carbon atoms, more preferably 1 to 20 carbon atoms, and even more preferably 1 to 12 carbon atoms, for example, methylthio, ethylthio, etc.), an arylthio ligand (preferably having 6 to 30 carbon atoms, more preferably 6 to 20 carbon atoms, even more preferably 6 to 12 carbon atoms, for example, phenylthio, etc.), a heteroarylthio ligand (preferably having 1 to 30 carbon atoms, more preferably 1 to 20 carbon atoms, even more preferably 1 to 12 carbon atoms, for example, pyridylthio, 2-benzimidazolylthio, 2-benzoxazolylthio, 2-benzothiazolylthio, etc.), a siloxy ligand (preferably having 1 to 30 carbon atoms, more preferably 3 to 25 carbon atoms, even more preferably 6 to 20 carbon atoms, for example, a triphenylsiloxy group, a triethoxysiloxy group, a triisopropylsiloxy group, etc.), an aromatic hydrocarbon anion ligand (preferably having 6 to 30 carbon atoms, more preferably 6 to 25 carbon atoms, even more preferably 6 to 20 carbon atoms, for example, a phenyl anion, a naphthyl anion, an anthranyl anion, etc.), an aromatic heterocyclic anion ligand (preferably having 1 to 30 carbon atoms, more preferably 2 to 25 carbon atoms, even more preferably 2 to 20 carbon atoms, for example, a pyrrole anion, a pyrazole anion, a triazole anion, an oxazole anion, a benzoxazole anion, a thiazole anion, a benzothiazole anion, a thiophene anion, a benzothiophene anion, etc.), and an indolenine anion ligand, preferably a nitrogen-containing heterocyclic ligand, an aryloxy ligand, a heteroaryloxy group or a siloxy ligand, more preferably a nitrogen-containing heterocyclic ligand, an aryloxy ligand, a siloxy ligand, an aromatic hydrocarbon anion ligand or an aromatic heterocyclic anion ligand.

Examples of the metal complex electron transporting host material include compounds described in, for example, JP-A Nos. 2002-235076, 2004-214179, 2004-221062, 2004-221065, 2004-221068 and 2004-327313.

Specific examples of such electron transporting host materials include, but are not limited to, the following materials:

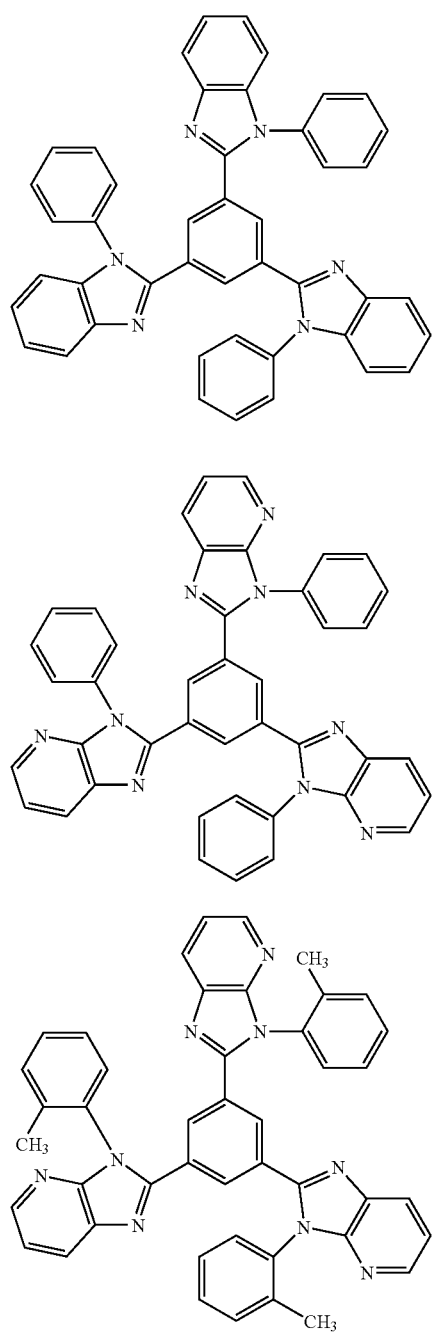

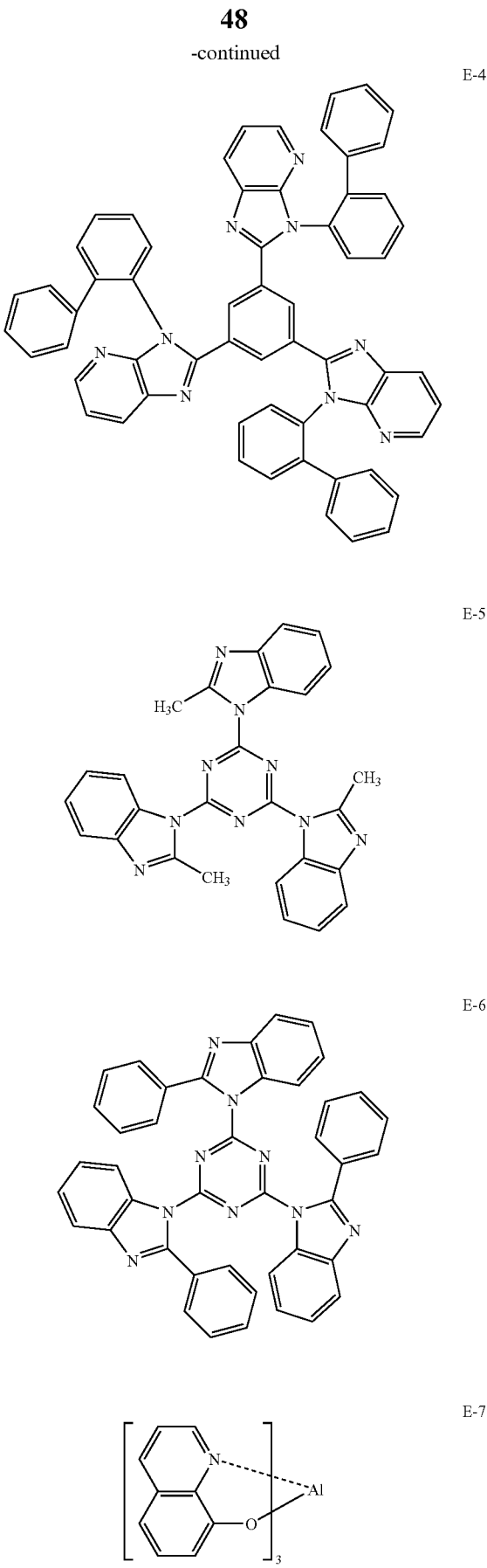

E-8
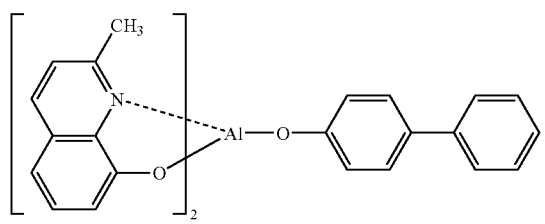
E-9
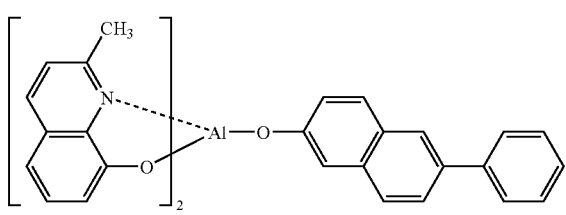
E-10
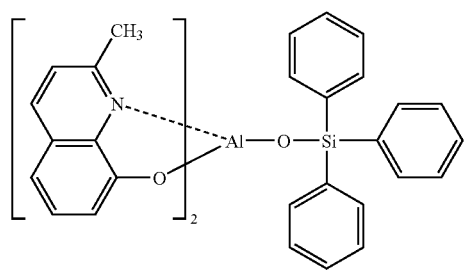
E-11
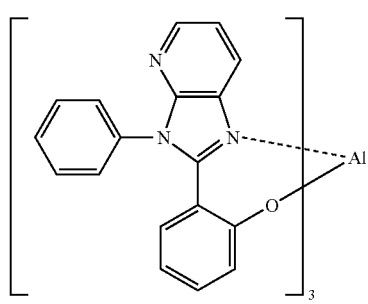
E-12
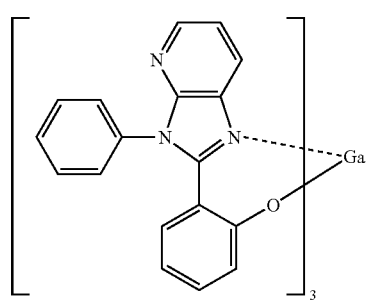
E-13
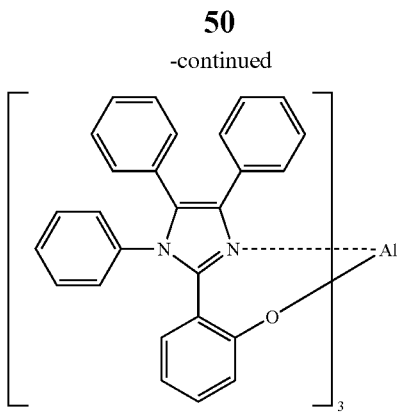
E-14
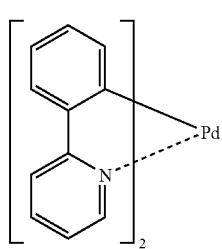
E-15
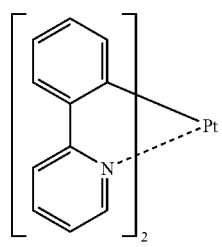
E-16
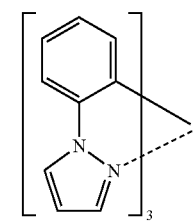
E-17
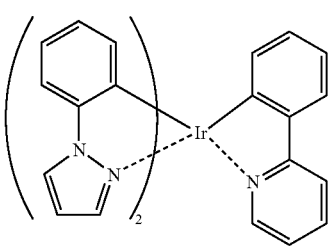
E-18
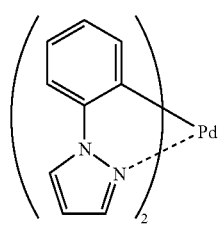

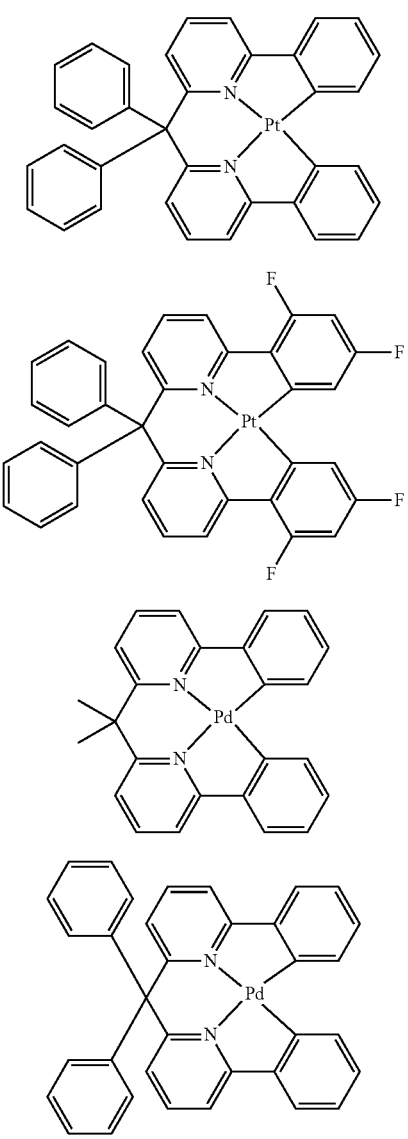

E-19

E-20

E-21

E-22

For the purpose of further improving luminous efficiency and durability, two or more types of hole transporting hosts and electron transporting hosts may be mixed in the invention by methods disclosed in JP-A Nos. 2005-233037, 2006-165526, Japanese Patent Application No. 2007-32587, and JP-A No. 2008-198801. In addition, for the purpose of further improving luminous efficiency and durability, hydrocarbon compounds such as adamantane compounds may be effectively added in the invention by a method disclosed in JP-A No. 2005-294250.

The host materials may be used singly or as a mixture of two or more thereof, and the host material may be, for example, a mixture of an electron transporting host material and a hole transporting host material.

In the luminescence layer of the invention, the ratio of the phosphorescence material to the host material, in terms of mass ratio, is 50:50 to 0.1 to 99.9, preferably 40:60 to 1:99, more preferably 30:70 to 3:97. In the luminescence layer of the invention, the density of the luminescence material may be changed gradually or stepwise by methods disclosed in JP-A Nos. 2009-32976, 2009-32977, 2009-32988, 2009-32989 and 2009-32990, for the purpose of improvement of luminous efficiency and durability.

The blue phosphorescence material described above is contained preferably in an amount of 5 to 30 mass %, more preferably 10 to 25 mass %, in the luminescence layer. When the density of the blue phosphorescence material in the luminescence layer is 5% by weight or more, blue emission may be reliably emitted, and the doped amount may, be easily adjusted in deposition. On the other hand, when the density of the blue phosphorescence material in the luminescence layer is 30% by weight or less, blue color may be prevented from becoming too strong as compared with other colors (green and red), and an organic electroluminescence device for emitting white color may be more reliably produced.

The host materials contained in the blue luminescence layer that contains a blue phosphorescence material include, for example, those having a carbazole skeleton, those having a diaryl amine skeleton, those having a pyridine skeleton, those having a pyrazine skeleton, those having a triazine skeleton, and those having an aryl silane skeleton, as well as materials exemplified in the sections of hole injecting layer, hole transporting layer, electron injecting layer, and electron transporting layer that will be described later.

For effectively transporting and recombining charges, the density of the host material contained in the blue luminescence layer is preferably 70% by weight or more, more preferably 75% by weight or more, still more preferably 90% by weight or more. The host materials may be contained singly or in combination of two or more thereof.

The thickness of the blue luminescence layer is not particularly limited, but from the viewpoint of luminous efficiency improvement, drive voltage reduction, etc., the thickness is preferably 1 nm to 500 nm, more preferably 5 nm to 200 nm, even more preferably 10 nm to 100 nm.

The green phosphorescence material and the red phosphorescence material may be contained separately in a green luminescence layer and a red luminescence layer, respectively, or may be contained in the same luminescence layer in which the green phosphorescence material and the red phosphorescence material are mixed. Alternatively, the green phosphorescence material and the blue phosphorescence material are mixed and contained in the same luminescence layer, or the red phosphorescence material and the blue phosphorescence material are mixed and contained in the same luminescence layer.

The green phosphorescence material is contained preferably in an amount of 5 to 30% by weight, more preferably 10 to 25% by weight, in the luminescence layer. When the density of the green phosphorescence material in the luminescence layer is 5% by weight or more, green emission may be reliably emitted, and the doped amount may be easily adjusted in deposition. On the other hand, when the density of the green phosphorescence material in the luminescence layer is 30% by weight or less, green color may be prevented from becoming too strong as compared with other colors (blue and red), and an organic electroluminescence device for emitting white color may be more reliably produced.

The red phosphorescence material is contained preferably in an amount of 0.2 to 10% by weight, more preferably 0.2 to 5% by weight, in the luminescence layer. When the density of the red phosphorescence material in the luminescence layer is 0.2% by weight or more, red emission may be reliably emitted, and the doped amount may be easily adjusted in deposition. On the other hand, when the density of the red phosphorescence material in the luminescence layer is 10% by weight or less, red color may be prevented from becoming too strong as compared with other colors (blue and green), and an organic electroluminescence device for emitting white color may be more reliably produced.

The host materials contained in the green phosphorescence material and/or the red phosphorescence material include, for example, those having a carbazole skeleton, those having a diaryl amine skeleton, those having a pyridine skeleton, those having a pyrazine skeleton, those having a triazine skeleton, and those having an aryl silane skeleton, as well as materials exemplified in the sections of hole injecting layer, hole transporting layer, electron injecting layer, and electron transporting layer that will be described later.

For effectively transporting and recombining charges, the density of the host material contained in the luminescence layer containing the green phosphorescence material and/or the red phosphorescence material is preferably 70% by weight or more, more preferably 90% by weight or more. The host materials may be contained singly or as a mixture of two or more thereof.

The thickness of the luminescence layer containing the green phosphorescence material and/or the red phosphorescence material is not particularly limited, but from the viewpoint of luminous efficiency improvement, drive voltage reduction, etc., the thickness is preferably 1 nm to 500 nm, more preferably 5 nm to 200 nm, even more preferably 10 nm to 100 nm.

(Intermediate Layer)

In the present invention, an intermediate layer is provided between the luminescence layers for suppressing excitons generated in a luminescence layer from transferring energy to the other luminescence layers. In particular, an intermediate layer is preferably provided for suppressing excitons generated in a blue luminescence layer from transferring energy to the other luminescence layers.

In the intermediate layer of the invention, a charge transporting material having a lowest excited triplet energy level (T1) of 2.7 eV or more and being higher by at least 0.15 eV than T1 of a phosphorescence material having a shortest wavelength emission among the phosphorescence materials (for example, of the blue phosphorescence material) is contained. The T1 of the charge transporting material is more preferably 2.8 eV or more, even more preferably 2.9 eV or more, and its difference in T1 (ΔT1) from the blue phosphorescence material is preferably 0.20 eV or more, more preferably 0.28 eV or more.

The charge transporting materials contained in the intermediate layer include, for example, those having a carbazole skeleton, those having a diaryl amine skeleton, those having a pyridine skeleton, those having a pyrazine skeleton, those having a triazine skeleton, and those having an aryl silane skeleton, as well as materials exemplified in the sections of hole transporting host material, electron transporting host material, hole injecting layer, hole transporting layer, electron injecting layer, and electron transporting layer that will be described later.

For effectively transporting and recombining charges, the density of the charge transporting material contained in the intermediate layer is preferably 60% by weight or more, more preferably 70% by weight or more, still more preferably 80% by weight or more. The intermediate layer may contain two or more kinds of charge transporting materials described above.

Examples of the charge transporting material contained in the intermediate layer include those shown below. However, the material is not limited thereto.

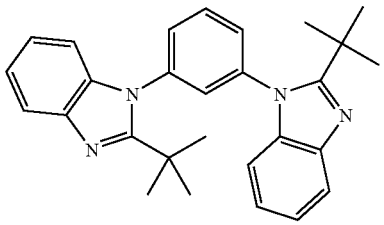

H-1

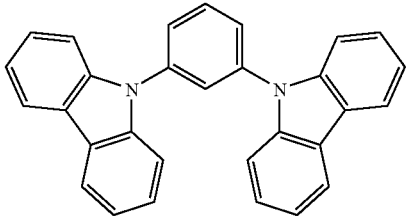

H-2

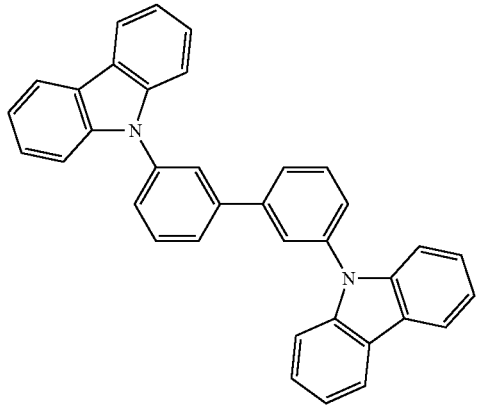

H-3

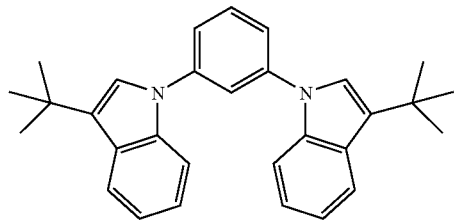

H-4

The thickness of the intermediate layer is not particularly limited, but from the viewpoint of luminous efficiency improvement, drive voltage reduction, etc., the thickness is preferably 0.1 to 10 nm, more preferably 0.1 to 5 nm, even more preferably 0.1 to 3 nm.

The total thickness of the luminescence layers and the intermediate layers is preferably 10 to 60 nm, more preferably 20 to 50 nm, even more preferably 25 to 40 nm. When the total thickness is 10 nm or more, luminous efficiency and durability may be improved, and when the total thickness is 60 nm or less, drive voltage may be prevented from increasing.

For emitting white color, the emission intensity ratio of the minimum value to the maximum value in the emission peak wavelength of blue, green and red phosphorescence materials is preferably in the range of 5:95 to 50:50, more preferably in the range of 20:80 to 40:60. In the organic electroluminescence device of the invention, excitons are prevented from transferring energy between the phosphorescence materials, and thus the emission peaks in each emission region of RGB appears clearly, and particularly when the emission intensity ratio between the minimum value to the maximum value is in the range described above, emissions of the luminescence materials are mixed so that an organic electroluminescence device for emitting white color with less color unevenness may be obtained.

(Layer Structure)

The organic electroluminescence device of the invention includes at least a first luminescence layer and a second luminescence layer between a pair of electrodes, and may also include other organic layers arranged between a pair of electrodes and luminescence layers. In the invention, the organic layers other than the luminescence layer and intermediate layer may include a hole injecting layer, a hole transporting layer, an electron transporting layer, an electron injecting layer, an electron blocking layer and a hole blocking layer. For example, there is an aspect as shown in FIG. 1 wherein on a substrate 1, laminated are, starting from the side of an anode 2, a hole injecting layer 3, a hole transporting layer 4, a first luminescence layer 5-1, an intermediate layer 9, a second luminescence layer 5-2, an electron transporting layer 6, and an electron injecting layer 7 in this order, which may further have a charge blocking layer between the hole transporting layer 4 and the first luminescence layer 5-1 and may further have a hole blocking layer and the like between the second luminescence layer 5-2 and the electron transporting layer 6, for example.

Another aspect of the structure of the organic electroluminescence device of the invention as shown in FIG. 2 has, on a substrate 1, a pair of oppositely placed electrodes 2 and 8 and organic layers placed between the electrodes 2 and 8, specifically a hole injecting layer 3, a hole transporting layer 4, a first luminescence layer 15-1, a first intermediate layer 19-1, a second luminescence layer 15-2, a second intermediate layer 19-2, a third luminescence layer 15-3, an electron transporting layer 6, and an electron injecting layer 7 in this order from the anode 2 side. The organic layers may further have a charge blocking layer between the hole transporting layer 4 and the first luminescence layer 15-1 or may further have a hole blocking layer and the like between the third luminescence layer 15-3 and the electron transporting layer 6, for example.

The hole injecting layer 3 between the anode 2 and the hole transporting layer 4 may not be included, and the electron injecting layer 7 between the cathode 8 and the electron transporting layer 6 may not be included. Each layer may be divided into plural sublayers.

In the organic electroluminescence device of the invention, the at least two luminescence layers preferably include a layer containing a hole transporting host material having an ionization potential (Ip) of 5.1 to 6.4 eV and an electron affinity (Ea) of 1.2 to 3.1 eV, and a layer containing an electron transporting host material and/or an electron transporting luminescence material where the electron transporting host material has an Ip of 5.7 to 7.5 eV and an Ea of 2.5 to 3.5 eV and the electron transporting luminescence material has an Ip of 5.7 to 7.0 eV and an Ea of 2.5 to 3.5 eV, in this order from the anode side. The above described layer structure enables the organic electroluminescence device of the invention to improve luminescence efficiency and drive durability by suppressing an electron from transferring to the hole transporting layer and by suppressing a hole from transferring to the electron transporting layer.

The values of Ip and Ea of the compounds used in the examples described below are as follows:
Platinum complex 1: Ip: 6.3 eV, Ea: 2.9 eV;
Platinum complex 2: Ip: 6.2 eV, Ea: 2.8 eV;
Platinum complex 3: Ip: 6.3 eV, Ea: 2.9 eV;
Charge transporting material 1: Ip: 6.2 eV, Ea: 2.8 eV;
Charge transporting material 2: Ip: 7.2 eV, Ea: 2.8 eV;
Iridium complex 1: Ip: 5.4 eV, Ea: 2.6 eV;
Iridium complex 2: Ip: 5.4 eV, Ea: 2.6 eV;
Iridium complex 3: Ip: 5.4 eV, Ea: 2.4 eV;
Iridium complex 4: Ip: 5.4 eV, Ea: 2.3 eV;
Charge transporting material A: Ip: 5.8 eV, Ea: 2.4 eV; and
Charge transporting material B: Ip: 5.9 eV, Ea: 2.4 eV.

Organic layers, electrodes, substrate, etc. other than the luminescence layers and the intermediate layers of the organic electroluminescence device of the invention will be described below.

(Hole Injecting Layer, Hole Transporting Layer)

The hole injecting layer and the hole transporting layer are layers having a function of receiving holes from the anode or the side of the anode and transporting the holes into the side of the cathode.

The hole injecting layer preferably contains an electron accepting material serving as a carrier for hole transfer. The electron accepting material introduced into the hole injecting layer may be an organic or inorganic compound as long as it is electron-accepting to exhibit a property of oxidizing an organic compound, and specifically the organic compound is preferably a Lewis acid such as ferric chloride, aluminum chloride, gallium chloride, indium chloride or antimony pentachloride.

The organic compound is preferably a compound having, as a substituent, a nitro group, a halogen atom, a cyano group or a trifluoromethyl group, or a quinone compound, an acid anhydride compound or fullerenes.

Specific examples include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanonbenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronapthoquinone, 1-nitronaphthalene, 2-nitronaphthalene, 1,3-dinitronaphthalene, 1,5-dinitronaphthalene, 9-cyanoanthracene, 9-nitroanthracene, 9,10-anthraquinone, 1,3,6,8-tetranitrocarbazole, 2,4,7-trinitro-9-fluorenone, 2,3,5,6-tetracyaopyridine, maleic anhydride, phthalic anhydride, fullerene C60, and fullerene C70.

Preferable among those described above are hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanonbenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronapthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyaopyridine, and fullerene C60, among which particularly preferable are hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronapthoquinone, 1,2,4,5-tetracyanonbenzene, 2,3-dichloro-5,6-dicyanobenzoquinone, and 2,3,5,6-tetracyaopyridine.

These electron accepting materials may be used alone or as a mixture of two or more thereof.

The amount of the electron accepting dopant used varies depending on the type of material used, but is preferably 0.01 to 50% by weight, more preferably 0.05 to 20% by weight, even more preferably 0.1 to 10% by weight, based on the material of the hole injecting layer. An amount of less than 0.01% by weight based on the hole injecting material is not preferable because the effect of the invention is insufficient, while an amount of more than 50% by weight is not preferable because its hole injection ability is deteriorated.

Specifically, the hole injecting layer and the hole transporting layer are preferably layers containing materials such as pyrrole derivatives, carbazole derivatives, pyrazole derivatives, triazole derivatives, oxazole derivatives, oxadiazole derivatives, imidazole derivatives, polyaryl alkane derivatives, pyrazoline derivatives, pyrazolone derivatives, phenylene diamine derivatives, aryl amine derivatives, amino-substituted chalcone derivatives, styryl anthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, organic silane compounds, or carbon.

The thickness of the hole injecting layer or the hole transporting layer is not particularly limited, but from the viewpoint of drive voltage reduction, improvement in luminescent efficiency and durability, the thickness is preferably 1 nm to 5 µm, more preferably 5 nm to 1 µm, even more preferably 10 nm to 500 nm.

Each of the hole injecting layer and the hole transporting layer may be of a single layered structure having one or more of the materials described above or a multi-layered structure having plural layers each of the same composition or different compositions.

(Electron Injecting Layer, Electron Transporting Layer)

The electron injecting layer and the electron transporting layer are layers having a function of injecting electrons from the cathode, a function of transporting the electrodes or a function of blocking holes injected from the anode.

An electron-donating material to be introduced into the electron injecting layer or the electron transporting layer only has to be electron-donating to exhibit a property of reducing an organic compound, and an alkali metal such as Li, an alkaline earth metal such as Mg, and a transition metal including a rare earth metal are preferably used.

Particularly, a metal having a work function of 4.2 eV or less is preferably used. Specific examples of such metals include Li, Na, K, Be, Mg, Ca, Sr, Ba, Y, Cs, La, Sm, Gd and Yb.

These electron donating materials may be used alone or as a mixture of two or more thereof.

The amount of the electron donating material used varies depending on the type of material used, but is preferably 0.1 to 99% by weight, more preferably 0.2 to 70% by weight, particularly preferably 0.3 to 50% by weight, based on the material of the electron transporting layer. An amount of less than 0.1% by weight based on the amount of the material of the electron transporting layer is not preferable because the effect of the invention is insufficient, while an amount of more than 99% by weight is not preferable because its electron transporting ability is deteriorated.

Specific examples of the materials of the electron injecting layer and the electron transporting layer include pyridine, pyrimidine, triazine, imidazole, triazole, oxazole, oxadiazole, fluorenone, anthraquinodimethane, anthron, diphenylquinone, thiopyrane dioxide, carbodiimide, fluorenylidene methane, distyrylpyradine, fluorine-substituted aromatic compounds, aromatic tetracarboxylic anhydrides such as naphthalene and perylene, phthalocyanine, and derivatives thereof (which may form condensed rings with other rings), and various metal complexes such as metal complexes of 8-quinolinole derivatives, and metal complexes having metal phthalocyanine, benzoxazole, or benzothiazole as the ligand.

The thickness of the electron injecting layer or the electron transporting layer is not particularly limited, but from the viewpoint of drive voltage reduction, improvement in luminous efficiency and durability, the thickness is preferably 1 nm to 5 µm, more preferably 5 nm to 1 µm, particularly preferably 10 nm to 500 nm.

Each of the electron injecting layer and the electron transporting layer may be of a single layered structure having one or more of the materials described above or a multi-layered structure having plural layers each of the same composition or different compositions.

(Hole Blocking Layer)

The hole blocking layer is a layer having a function of preventing holes transported from the side of the anode to the luminescence layer from passing through into the side of the cathode. In the invention, the hole blocking layer may be arranged as an organic layer adjacent to the luminescence layer on the side of the cathode.

The hole blocking layer is not particularly limited. Specifically, the hole blocking layer may contain aluminum complexes such as BAlq, triazole derivatives, and pyrazabole derivatives.

To reduce drive voltage, the thickness of the hole blocking layer is generally preferably 50 nm or less, preferably 1 to 50 nm, more preferably 3 nm to 30 nm.

(Electron Blocking Layer)

The electron blocking layer is a layer having a function of preventing electrons transported from the side of the cathode to the luminescence layer from passing through into the side of the anode. In the invention, the electron blocking layer may be arranged as an organic layer adjacent to the luminescence layer on the side of the anode.

The electron blocking layer is not particularly limited. Specifically, the electron blocking layer may contain amine compounds such as NPD and carbazole compounds.

To reduce drive voltage, the thickness of the electron blocking layer is generally preferably 50 nm or less, preferably 1 to 50 nm, more preferably 3 nm to 30 nm.

(Anode)

At least one of a pair of electrodes is a transparent electrode such that light generated in the luminescence layer may pass through it. Usually, the electrode (lower electrode) at the side of a substrate serves as an anode and the electrode (upper electrode) at the side of a sealing substrate (not shown) as a cathode; however, the lower electrode may serve as a cathode and the upper electrode as an anode.

As long as the anode has a function as an electrode supplying holes to an organic EL layer, the shape, structure, size, etc. thereof are not particularly limited and may be suitably selected from known electrode materials depending on the use application, purpose etc. of the organic electroluminescence device.

Preferable examples of the material of the anode include, metals, alloys, metal oxides, conductive compounds or mixtures of them. Specific examples of the anode material include conductive metal oxides such as tin oxide doped with antimony, fluorine, etc. (ATO, FTO), tin oxide, zinc oxide, indium oxide, indium tin oxide (ITO), and indium zinc oxide (IZO), metals such as gold, silver, chromium and nickel, as well as mixtures or laminates of such metals with conductive metal oxides, inorganic conductive materials such as copper iodide, and copper sulfide, organic conductive materials such as polyaniline, polythiophene and polypyrrole, and laminates thereof with ITO. Preferred among them are conductive metal oxides, among which ITO is particularly preferred from the viewpoint of productivity, high conductivity, transparency, etc.

The method of forming the anode includes, for example, wet methods such as a printing method and a coating method, physical methods such as a vacuum vapor deposition method, a sputtering method and an ion plating method, and chemical methods such as CVD and plasma CVD, from which a suitable method may be selected in consideration of the adaptability to the material constituting the anode 2. For example, when ITO is used as an anode material, the anode material may be formed into the anode in accordance with a DC or RF sputtering method, a vacuum deposition method, an ion plating method, etc.

The position where the anode is formed may be suitably selected in accordance with the use application, purpose, etc. of the organic electroluminescence device, and the anode may be formed on the entire or a part of the substrate.

Patterning in forming the anode may be conducted by chemical etching adopting photolithography, etc., or by physical etching adopting laser, etc. Further, the patterning may be conducted by vacuum vapor deposition, sputtering, etc., via a mask stacked thereon, or by a lift-off method or a printing method.

The thickness of the anode may be suitably selected depending on the material constituting the anode, but is usually about from 10 nm to 50 µm, preferably 50 nm to 20 µm.

The resistance value of the anode is preferably $10^3 \Omega/\square$ or less, more preferably $10^2 \Omega/\square$ or less, in order to supply holes reliably to the organic EL layer.

For taking out light emission from the side of the anode, the transmittance is preferably 60% or higher, more preferably 70% or higher. A transparent anode is described in detail in "New Development of Transparent Electrode Film", supervised by Yutaka Sawada and published from CMC (1999), and the matters described therein may be applied to the invention. For example, when a plastic substrate of low heat resistance is used, a transparent anode using ITO or IZO, deposited at a low temperature of 150° C. or less, is preferred.

(Cathode)

The cathode usually has a function as an electrode for injecting electrons into the organic layer, is not particularly limited with respect to its shape, structure, size, etc. thereof, and may be suitably selected from known electrode materials depending on the use application, purpose etc., of the organic electroluminescence device. The material constituting the cathode includes, for example, metals, alloys, metal oxides, electroconductive compounds, and mixtures thereof. Specific examples thereof include alkali metals (for example, Li, Na, K, and Cs), alkaline earth metals (for example, Mg and Ca), gold, silver, lead, aluminum, sodium-potassium alloy, lithium-aluminum alloy, magnesium-silver alloy, indium, and rare earth metals such as ytterbium. These materials may be used alone, but from the viewpoint of attaining both stability and electron injecting property, two or more of these materials may be preferably used.

Preferable materials among these materials constituting the cathode are alkali metals or alkaline earth metals from the viewpoint of electron injecting property, among which those materials based on aluminum are preferred from the viewpoint of excellent storage stability. Those materials based on aluminum refer to aluminum per se, an alloy of aluminum and 0.01 to 10% by weight alkali metal or alkaline earth metal, or a mixture thereof (for example, lithium-aluminum alloy, magnesium-aluminum alloy, etc.). Materials of a cathode are described in detail in JP-A Nos. 2-15595 and 5-121172 and the materials described in the publications may be applied also to the invention.

The method of forming the cathode is not particularly limited, and the cathode may be formed in accordance with known methods. For example, the cathode may be formed by a method suitably selected from wet methods such as a printing method and a coating method, physical methods such as a vacuum vapor deposition method, a sputtering method and an ion plating method, and chemical methods such as a CVD or plasma CVD method, under consideration of the adaptability to the material constituting the cathode. For example, when metals or the like are selected as the cathode material, the metals may be formed into the cathode 8 in accordance with a sputtering method and the like by one of them or plural them simultaneously or successively.

The thickness of the cathode may be suitably selected depending on the material constituting the cathode and on the direction of light in which it is extracted, and it is usually about 1 nm to 5 µm. The cathode may be transparent or opaque. For example, when the transparent cathode is formed, the material of the cathode may be deposited to form a film of about 1 to 10 nm in thickness followed by lamination with a transparent electroconductive material such as ITO or IZO.

Patterning in forming the cathode may be conducted by chemical etching adopting photolithography, etc., or by physical etching adopting laser, etc. Further, the patterning may be conducted by vacuum vapor deposition, sputtering, etc. with a mask, or by a lift-off method or a printing method.

The position where the cathode is formed is not particularly limited, and the cathode may be formed on the entire or a part of the organic layer.

Between the cathode and the organic layer, a dielectric layer of fluorides or oxides of an alkali metal or alkaline earth metal may be formed to a thickness of 0.1 to 5 nm. This dielectric layer may be regarded as one type of electron injecting layer. The dielectric layer may be formed, for example, by vapor deposition, sputtering, ion plating or the like.

(Substrate)

The substrate used in the invention is not, limited as long as it is a substrate being capable of supporting the whole of the organic electroluminescence device and having heat resistance, strength, optical transparency, etc., and may be a known substrate. Examples of the substrate material include yttrium stabilized with zirconia (YSZ), inorganic materials such as glass, polyesters such as polyethylene terephthalate, polybutylene phthalate and polyethylene naphthalate, and organic materials such as polystyrene, polycarbonate, polyether sulfone, polyarylate, polyimide, polycycloolefin, norbornene resin, and poly(chlorotrifluoroethylene).

When glass is used as the substrate, the glass is preferably alkali-free glass in order to reduce ions eluted from the glass. When soda lime glass is used, the glass onto which a barrier coat such as silica has been applied is preferably used.

When a substrate consisting of an organic material is used, the substrate is preferably one excellent in heat resistance, dimensional stability, solvent resistance, electrical insulation, and workability. Particularly when a plastic substrate is used, the substrate is preferably provided on one or both sides thereof with a moisture permeation preventing layer or a gas barrier layer in order to prevent the penetration of moisture and oxygen. The material of the moisture permeation preventing layer or the gas barrier layer is preferably an inorganic material such as silicon nitride and silicon oxide. The moisture permeation preventing layer or the gas barrier layer may be formed by, for example, high-frequency sputtering or the like.

When a thermoplastic substrate is used, it may further be provided, if necessary, with a hard coat layer, an undercoat layer etc.

The substrate is not particularly limited with respect to its shape, structure, size, etc. and may be suitably selected depending on the use application, purpose, etc. of the organic luminescence device. Generally, the shape of the substrate is preferably a plate from the viewpoint of handleability, the formability of the organic electroluminescence device, and the like. The structure of the substrate may be either a single layer structure or a laminate structure. The substrate may be composed of a single member or two or more members.

When the substrate is of a top emission type wherein light is taken out from the side of the device opposite to the substrate, the extraction of emission from the side of the substrate is not necessary, and thus metal substrates such as stainless steel, Fe, Al, Ni, Co, Cu and alloys thereof or silicon substrates may also be used. When a metal substrate is used, the substrate has high strength and high gas barrier properties against moisture and oxygen in air, even if it is small in thickness. When a metal substrate is used, the substrate may be provided with an insulating film for securing gas-insulating properties between the substrate and the lower electrode.

(Protective Layer)

The organic electroluminescence device of the invention may be protected by a protective layer. The material for constituting the protective layer may be any material that suppresses intrusion of moisture or oxygen into the device, thereby accelerating deterioration of the device.

Specific examples thereof include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal nitrides such as $SiN_X$ and $SiN_xO_y$, metal fluorides such as $MgF_2$, LiF, $AlF_3$, and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluouroethylene, a copolymer obtained by copolymerizing tetrafluoroethylene with a monomer mixture containing at least one comonomer, a fluoro-containing copolymer having a cyclic structures in the copolymerization main chain, water absorbing material with a water absorptivity of 1% or more, and a moisture proofing material with a water absorptivity of 0.1% or less.

The method of forming the protective layer is not particularly limited, and for example, a vacuum vapor deposition method, a sputtering method, a reactive sputtering method, an MBE (Molecular Beam Epitaxy) method, a cluster ion beam method, an ion plating method, a plasma polymerization method (RF-excited ion plating method), a plasma CVD method, a laser CVD method, a thermal CVD method, a gas source CVD method, a coating method, a printing method, or a transfer method may be applied.

(Sealing)

The organic electroluminescence device of the invention may be sealed with a sealing member such as sealing vessel. A water absorbent or an inert liquid may be sealed in the space between the sealing vessel and the electroluminescence device. The water absorbent is not particularly limited and may include, for example, barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited and includes, for example, paraffins, liquid paraffins, fluoro-solvents such as perfluoro alkanes or perfluoro amines and perfluoro ethers, chlorosolvents, and silicone oils.

To generate light in the organic electroluminescence device of the invention, external wirings such as control wirings and signal wirings are connected to the electrodes. An emission device provided with the organic electroluminescence device of the invention may thereby be produced. The driving system of the emission device provided with the organic electroluminescence device of the invention is not limited and may be either a passive matrix system or an active matrix system.

The organic electroluminescence device of the invention may attain emission by applying a DC (which may optionally contain AC component) voltage (usually from 2 to 15 V) or a DC current between the anode and the cathode.

For the method of driving the organic electroluminescence device of the invention, driving methods described, for example, in JP-A Nos. 2-148687, 6-301355, 5-29080, 7-134558, 8-234685, and 8-241047, Japanese Patent No. 2784615, and U.S. Pat. Nos. 5,828,429 and 6,023,308 may be used.

(Use Application of the Invention)

The organic electroluminescence device of the invention may be used preferably in indicating devices, displays, backlights, electronograph, illumination sources, recording light sources, exposure sources, reading light sources, markers, signboards, interior designs, optical communication, etc.

Exemplary embodiments of the invention are enumerated as follows:

<1> An organic electroluminescence device comprising a pair of electrodes on a substrate, two or more luminescence layers disposed between the electrodes, and an intermediate layer containing a charge transporting material and disposed between the two or more luminescence layers, wherein:

each of the two or more luminescence layers contains at least one phosphorescence materials selected from a blue phosphorescence material having an emission peak from 420 nm to less than 500 nm, a green phosphorescence material having an emission peak from 500 nm to less than 570 nm, and a red phosphorescence material having an emission peak from 570 nm to 650 nm, the phosphorescence materials contained in the respective luminescence layers having different emission peaks from one another; and the charge transporting material contained in the intermediate layer has an energy difference (T1) of 2.7 eV or more between a ground state and an excited triplet state and the energy difference (T1) of the charge transporting material is higher by at least 0.15 eV than T1 of a phosphorescence material having the shortest wavelength emission among the phosphorescence materials contained in the two or more luminescence layers.

<2> The organic electroluminescence device of <1>, wherein the two or more luminescence layers comprise a layer containing the blue phosphorescence material and a layer containing the green phosphorescence material and the red phosphorescence material.

<3> The organic electroluminescence device of <1>, wherein the two or more luminescence layers comprise a layer containing the blue phosphorescence material, a layer containing the green phosphorescence material and a layer containing the red phosphorescence material that are disposed in this order, and the intermediate layers comprise a first intermediate layer disposed between the layer containing the blue phosphorescence material and the layer containing the green phosphorescence material and a second intermediate layer disposed between the layer containing the green phosphorescence material and the layer containing the red phosphorescence material.

<4> The organic electroluminescence device of <1>, wherein the two or more layers comprise a layer containing the green phosphorescence material, a layer containing the blue phosphorescence material and a layer containing the red phosphorescence material that are disposed in this order, and the intermediate layers comprise a first intermediate layer disposed between the layer containing the green phosphorescence material and the layer containing the blue phosphorescence material and a second intermediate layer disposed between the layer containing the blue phosphorescence material and the layer containing the red phosphorescence material.

<5> The organic electroluminescence device of <1>, wherein the two or more luminescence layers comprise a layer containing the red phosphorescence material and a layer containing the green phosphorescence material and the blue phosphorescence material.

<6> The organic electroluminescence device of <1>, wherein the two or more luminescence layers comprise a layer containing the green phosphorescence material and a layer containing the red phosphorescence material and the blue phosphorescence material.

<7> The organic electroluminescence device of any one of <1> to <6>, wherein the intermediate layer is 0.1 to 10 nm in layer thickness.

<8> The organic electroluminescence device of any one of <1> to <7>, wherein each of the two or more luminescence layers further contains a host material.

<9> The organic electroluminescence device of <8>, wherein the two or more luminescence layers comprise, in this order from the anode side, a layer containing a hole transporting host material having an ionization potential (Ip) of from 5.1 to 6.4 eV and an electron affinity (Ea) of from 1.2 to 3.1 eV and a layer containing an electron transporting host material having an ionization potential (Ip) of from 5.7 to 7.5 eV and an electron affinity (Ea) of from 2.5 to 3.5 eV.

<10> The organic electroluminescence device of <8>, wherein the two or more luminescence layers comprise, in this order from the anode side, a layer containing a hole transporting host material having an ionization potential (Ip) of from 5.1 to 6.4 eV and an electron affinity (Ea) of from 1.2 to 3.1 eV and a layer containing an electron transporting luminescence material having an ionization potential (Ip) of from 5.7 to 7.0 eV and an electron affinity (Ea) of from 2.5 to 3.5 eV.

EXAMPLES

Hereinafter, the invention will be described in more detail with reference to the Examples, but the invention is not limited to these examples.

Example 1

1. Preparation of Organic EL Devices
(Preparation of Devices 1 to 4 of the Invention)
Organic EL devices having the structure shown in FIG. 1 are prepared as described below.
Substrate 1: A glass substrate of 0.5 mm in thickness and 2.5 cm per side was placed in a washing container, then subjected to ultrasonic cleaning in 2-propanol, and then to UV-ozone treatment for 30 minutes. The following layers were deposited by vacuum deposition on this transparent substrate. Unless otherwise noted, the deposition rate in the Examples of the invention is 0.2 nm/sec. The deposition rate was measured with a crystal oscillator. The film thickness shown below is also measured with a crystal oscillator.

Anode 2: Indium tin oxide (ITO) was deposited to a film thickness of 100 nm on the glass substrate 1.

Hole injecting layer 3: 4,4',4''-tris(N-(2-naphthyl)-N-phenyl-amino)-triphenylamine (abbreviated as 2-TNATA), and 2,3,5,6-tetrafluoro-7,7,8,8-tetracyanoquinodimethane (abbreviated as F4-TCNQ) in an amount of 1.0% by weight based on 2-TNATA were co-deposited on the anode 2. The vapor deposited film thickness was 160 nm.

Hole transporting layer 4: α-NPD (bis[N-(1-naphthyl)-N-phenyl]benzidine) was deposited to a thickness of 10 nm on the hole injecting layer 3.

First luminescence layer 5-1: Charge transporting material B having the following structure (1,3-bis(N-carbazolyl-9-yl)benzene) (abbreviated as mCP) and platinum complex 1 having the following structure were co-deposited on the hole transporting layer 4 such that the ratio of the platinum complex 1 to charge transporting material B became 15% by weight. The charge transporting material B has a T1 value of 2.89 eV and the platinum complex 1 has a T1 value of 2.82 eV and the emission peak of 456 nm. The thickness was 20 nm.

Intermediate layer 9: On the first luminescence layer 5-1, the charge transporting material 1 having the following structure (T1 is 3.10 eV) was deposited to a thickness of 0.5 nm for the device 1 of the invention, to a thickness of 1.0 nm for the device 2 of the invention, to a thickness of 5.0 nm for the device 3 of the invention, and to a thickness of 10.0 nm for the device 4 of the invention.

Second luminescence layer 5-2: On the intermediate layer 9, charge transporting material B, the platinum complex 2 having the following structure (T1 is 2.52 eV and the emission peak is 503 nm) and iridium complex 1 having the following structuer (T1 is 2.07 eV and the emission peak is 620 nm) (Ir(piq)₃) were co-deposited into a ternary codeposition such that the ratios of the platinum complex 2 and iridium complex 1 to charge transporting material B became 15% by weight and 0.5% by weight, respectively. The thickness was 10 nm.

Electron transporting layer 6: On the second luminescence layer 5-2, bis-(2-methyl-8-quinolinolato)-4-(phenyl-phenolate)-aluminium(III) (abbreviated as BAIq), was deposited to a thickness of 39 nm.

Electron injecting layer 7: On the electron transporting layer 6, Bathocuproin (abbreviated as BCP) was deposited to a thickness of 1 nm.

Cathode 8: On the electron injecting layer 7, LiF was deposited to a thickness of 1 nm and then a patterned mask (a mask having a luminescence region of 2 mm×2 mm) was arranged, and metal aluminum was deposited in a depth of 100 nm to form a cathode.

The prepared laminate was placed in globe box previously flushed with an argon gas, and then sealed with a stainless-steel stealing can and with a UV-ray curable adhesive (trade name: XNR5516HV, manufactured by Nagase Chiba Co.).
(Preparation of Devices 5 to 8 of the Invention)
The organic EL devices having the structure shown in FIG. 2 are prepared as described below.
The devices 5 to 8 of the invention were prepared in the same manner as in preparation of the devices 1 to 4 of the invention except that the two luminescence layers 5-1 and 5-2 and the intermediate layer 9 were replaced by the following three luminescence layers 15-1, 15-2 and 15-3 and two intermediate layers 19-1 and 19-2.

First luminescence layer 15-1: On the hole transporting layer 4, charge transporting material B and the platinum complex 1 were co-deposited such that the ratio of the platinum complex 1 to charge transporting material B became 15% by weight. The thickness was 20 nm.

Intermediate layer 19-1: On the first luminescence layer 15-1, the charge transporting material 1 (T1 is 3.10 eV) was deposited to a thickness of 0.5 nm for the device 5 of the invention, to a thickness of 1.0 nm for the device 6 of the invention, to a thickness of 5.0 nm for the device 7 of the invention, and to a thickness of 10.0 nm for the device 8 of the invention.

Second luminescence layer 15-2: On the intermediate layer 19-1, charge transporting material B and the platinum complex 2 were co-deposited such that the ratio of the platinum complex 2 to charge transporting material B became 15% by weight. The thickness was 5 nm.

Intermediate layer 19-2: On the second luminescence layer 15-2, the charge transporting material 1 was deposited to a thickness of 0.5 nm for the device 5 of the invention, to a thickness of 1.0 nm for the device 6 of the invention, to a thickness of 5.0 nm for the device 7 of the invention, and to a thickness of 10.0 nm for the device 8 of the invention.

Third luminescence layer 15-3: On the intermediate layer 19-2, charge transporting material B and iridium complex 1 were co-deposited such that the ratio of iridium complex 1 to charge transporting material B became 5% by weight. The thickness was 5 nm.

(Preparation of Comparative Device A1)

Comparative device A1 was prepared in the same manner as in preparation of the device 1 of the invention except that the intermediate layer was not formed.

(Preparation of Comparative Device B1)

Comparative device B1 was prepared in the same manner as in preparation of the device 5 of the invention except that the intermediate layers were not formed.

(Preparation of Comparative Devices C1 to C4)

Comparative devices C1 to C4 were prepared in the same manner as in preparation of the device 1 of the invention except that the charge transporting material 1 of the intermediate material was changed to the charge transporting material B, the material was deposited to a thickness of 0.5 nm in the comparative device C1, to a thickness of 1.0 nm in the comparative device C2, to a thickness of 5.0 nm in the comparative device C3, and to a thickness of 10.0 nm in the comparative device C4.

(Preparation of Comparative Devices D1 to D4)

Comparative devices D1 to D4 were prepared in the same manner as in preparation of the device 5 of the invention except that the charge transporting material 1 of the intermediate material was changed to the charge transporting material B, and the material was deposited to a thickness of 0.5 nm in the comparative device D1, to a thickness of 1.0 nm in the comparative device D2, to a thickness of 5.3 nm in the comparative device D3, and to a thickness of 10.0 nm in the comparative device D4.

Structures of the materials used in the examples are shown below:

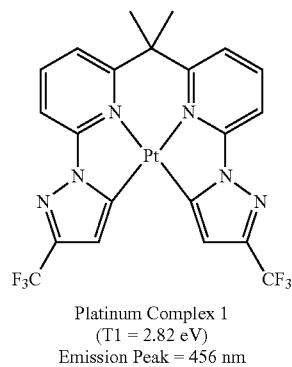

Platinum Complex 1
(T1 = 2.82 eV)
Emission Peak = 456 nm

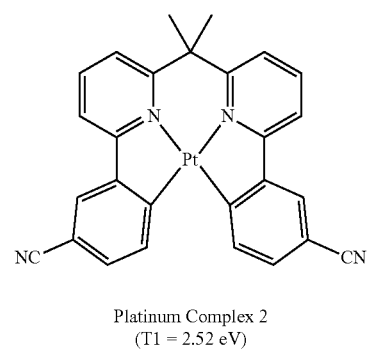

Platinum Complex 2
(T1 = 2.52 eV)
Emission Peak = 503 nm

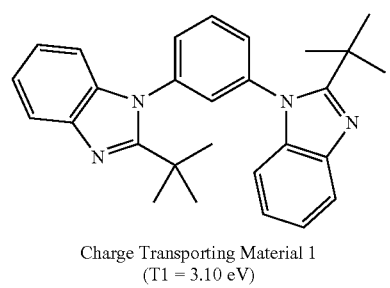

Charge Transporting Material 1
(T1 = 3.10 eV)

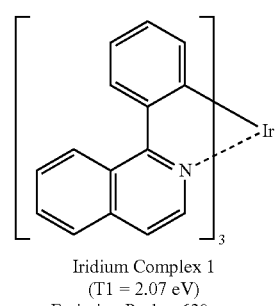

Iridium Complex 1
(T1 = 2.07 eV)
Emission Peak = 620 nm

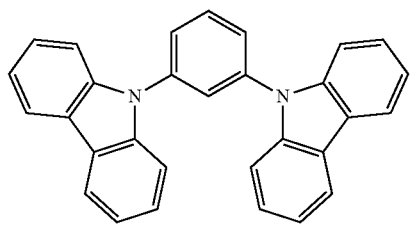

Charge Transporting Material B
(T1 = 2.89 eV)

-continued

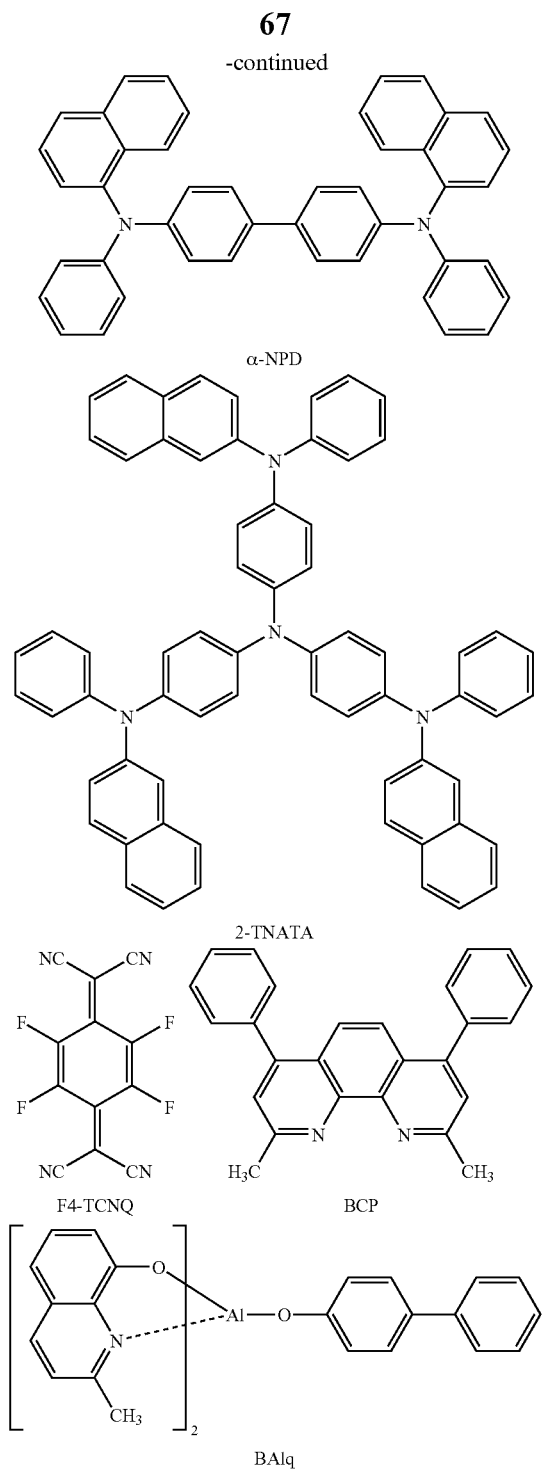

α-NPD

2-TNATA

F4-TCNQ

BCP

BAlq

-continued

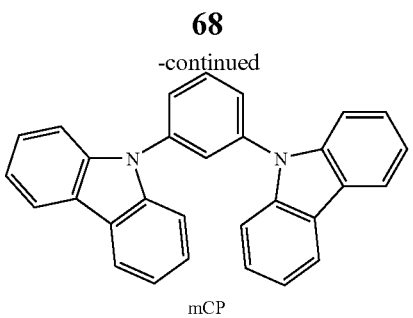

mCP

2. Evaluation of Performance

The performance of the devices of the invention and the comparative devices thus obtained was evaluated in the following manner.

1) Driving Voltage

Using a source measure unit 2400 manufactured by TOYO Corporation, DC voltage was applied to each device thereby causing emission of light. The voltage at which the brightness reached 1000 cd/m$^2$ was measured as the drive voltage.

2) External Quantum Efficiency

Using a source measure unit 2400 (manufactured by TOY(O)Corporation), DC voltage was applied to each device thereby causing emission of light. The brightness was measured with a brightness photometer BM-8 manufactured by Topcon Corporation. The emission spectrum and the emission wavelength were measured with a spectrum analyzer PMA-11 manufactured by Hamamatsu Photonics K. K. On the basis of these values, the external quantum efficiency at which the brightness reached 1000 cd/m$^2$ was calculated by a brightness conversion method.

3) Drive Durability

Using a source measure unit 2400 (manufactured by TOYO Corporation), DC voltage was applied to each device thereby causing emission of light such that the brightness reached 1000 cd/m$^2$. The emission was continued under the same current-voltage conditions, and the time taken for the brightness to be reduced to 500 cd/m$^2$ was measured. The devices 1 to 4 of the invention and the comparative devices C1 to C4 were evaluated relative to the comparative device A1, which is assumed to have a brightness half-life time ratio of 1, and the devices 5 to 8 of the invention and the comparative devices D1 to D4 were evaluated relative to the comparative device B1, which is assumed to have a brightness half-life time ratio of 1.

The obtained results are shown in Table 1.

TABLE 1

| | Device Structure | | | | Performance | | |
|---|---|---|---|---|---|---|---|
| Device No. | Film thickness of first luminescence layer (nm) | Film thickness of second luminescence layer (nm) | Film thickness of third luminescence layer (nm) | Film thickness of intermediate layer (nm) | Drive voltage (V) | External quantum efficiency (%) | Brightness half-life time ratio |
| Device 1 | 20 | 10 | | 0.5 | 6.9 | 8.6 | 1.9 |
| Device 2 | 20 | 10 | | 1.0 | 6.8 | 9.0 | 2.0 |
| Device 3 | 20 | 10 | | 5.0 | 7.1 | 7.6 | 1.8 |
| Device 4 | 20 | 10 | | 10.0 | 7.3 | 7.4 | 1.6 |

TABLE 1-continued

| Device No. | Film thickness of first luminescence layer (nm) | Film thickness of second luminescence layer (nm) | Film thickness of third luminescence layer (nm) | Film thickness of intermediate layer (nm) | Drive voltage (V) | External quantum efficiency (%) | Brightness half-life time ratio |
|---|---|---|---|---|---|---|---|
| Device 5 | 20 | 5 | 5 | 0.5 | 7.1 | 8.0 | 1.7 |
| Device 6 | 20 | 5 | 5 | 1.0 | 7.2 | 9.2 | 2.1 |
| Device 7 | 20 | 5 | 5 | 5.0 | 6.9 | 8.8 | 1.9 |
| Device 8 | 20 | 5 | 5 | 10.0 | 6.6 | 8.6 | 1.7 |
| Comparative Device A1 | 20 | 10 | | | 7.4 | 7.8 | 1 |
| Comparative Device B1 | 20 | 5 | 5 | | 7.8 | 6.7 | 1 |
| Comparative Device C1 | 20 | 10 | | 0.5 | 7.8 | 7.7 | 1.2 |
| Comparative Device C2 | 20 | 10 | | 1.0 | 8.0 | 7.7 | 1.2 |
| Comparative Device C3 | 20 | 10 | | 5.0 | 8.2 | 7.6 | 1.15 |
| Comparative Device C4 | 20 | 10 | | 10.0 | 8.5 | 7.5 | 1.1 |
| Comparative Device D1 | 20 | 5 | 5 | 0.5 | 7.1 | 8.0 | 1.1 |
| Comparative Device D2 | 20 | 5 | 5 | 1.0 | 7.4 | 7.8 | 1.2 |
| Comparative Device D3 | 20 | 5 | 5 | 5.0 | 7.7 | 7.5 | 1.15 |
| Comparative Device D4 | 20 | 5 | 5 | 10.0 | 7.9 | 7.2 | 1.1 |

From the results in Table 1, the devices 1 to 8 using the charge transporting material 1 in the intermediate layer, as compared with the comparative devices A1 and B1 not having an intermediate layer, and the comparative devices C1 to C4 and D1 to D4 using the charge transporting material B, had lower drive voltage and higher external quantum efficiency and were more excellent in drive durability. Particularly, the devices having an intermediate of 5.0 nm in thickness showed the most excellent performance.

The comparative charge transporting material B has a T1 value of 2.89 eV while the platinum complex 1 having a shortest wavelength emission among the phosphorescence materials contained in the luminescence layers has a T1 value of 2.82 eV, and thus the difference therebetween is as small as 0.07 eV and is estimated to fail to attain the effect of the invention.

The charge transporting material 1 has a T1 value of 3.10 eV which is higher by 0.28 eV than that of the platinum complex 1 in the luminescence layer and is thus estimated to contribute to the effect of the invention.

Example 2

1. Preparation of Organic EL Devices
(Preparation of Devices 9 to 12 of the Invention)

The devices 9 to 12 of the invention were prepared in the same manner as in preparation of the devices 1 to 4 of the invention in Example 1 except that the charge transporting material B of the luminescence layer was changed to the charge transporting material A having the following structure (T1 is 2.86 eV), the platinum complex 1 was changed to the platinum complex 3 having the following structure (T1 is 2.74 eV and the emission peak is 467 nm).

(Preparation of Devices 13 to 16 of the Invention)

The devices 13 to 16 of the invention were prepared in the same manner as in preparation of the devices 5 to 8 of the invention in Example 1 except that the charge transporting material B of the luminescence layer was changed to the charge transporting material A, the platinum complex 1 was changed to the platinum complex 3.

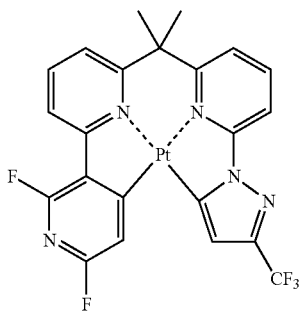

Platinum Complex 3
(T1 = 2.74 eV)
Emission peak = 467 nm

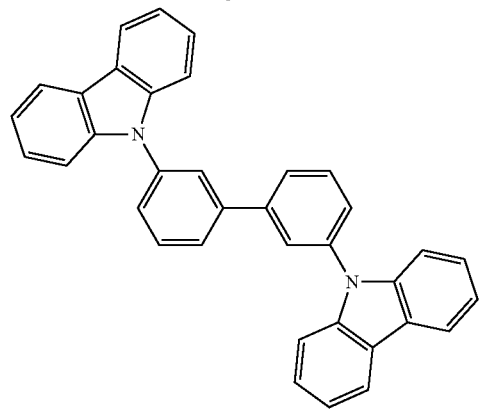

Charge Transporting Material A
(T1 = 2.86 eV)

(Preparation of Comparative Device E1)

Comparative device E1 was prepared in the same manner as in preparation of the device 9 of the invention except that the intermediate layer was not formed.

(Preparation of Comparative Device F1)

Comparative device F1 was prepared in the same manner as in preparation of the device 13 of the invention except that the intermediate layers were not formed.

(Preparation of Comparative Devices G1 to G4)

Comparative devices G1 to G4 were prepared in the same manner as in preparation of the device 9 of the invention except that the charge transporting material 1 of the intermediate material was changed to the charge transporting material A, the material was deposited to a thickness of 0.5 nm in the comparative device G1, to a thickness of 1.0 nm in the comparative device G2, to a thickness of 5.0 nm in the comparative device G3, and to a thickness of 10.0 nm in the comparative device G4.

(Preparation of Comparative Devices H1 to H4)

Comparative devices H1 to H4 were prepared in the same manner as in preparation of the device 13 of the invention except that the charge transporting material 1 of the intermediate material was changed to the charge transporting material A, the material was deposited to a thickness of 0.5 nm in the comparative device H1, to a thickness of 1.0 nm in the comparative device H2, to a thickness of 5.0 nm in the comparative device H3, and to a thickness of 10.0 nm in the comparative device H4.

2. Evaluation of Performance

The devices of the invention and the comparative devices thus obtained were evaluated in the same manner as in Example 1. With respect to the evaluation of drive durability, the devices 9 to 12 of the invention and the comparative devices G1 to G4 were evaluated relative to the comparative device E1, which is assumed to have a brightness half-life time ratio of 1, and the devices 13 to 16 of the invention and the comparative devices H1 to H4 were evaluated relative to the comparative device F1, which is assumed to have a brightness half-life time ratio of 1. The results are shown in Table 2.

As with Example 1, the charge transporting material A has a T1 value of 2.86 eV while the platinum complex 3 having a shortest wavelength emission among the phosphorescence materials contained in the luminescence layer has a T1 value of 2.74 eV, and thus the difference therebetween is as small as 0.12 eV and is thus estimated to fail to attain the effect of the invention.

The charge transporting material 1 has a T1 value of 3.10 eV which is higher by 0.36 eV than that of the platinum complex 3 in the luminescence layer and is thus estimated to contribute to the effect of the invention.

Example 3

1. Preparation of Organic EL devices (Preparation of Devices 17 to 20 of the Invention)

The devices 17 to 20 of the invention were prepared in the same manner as in preparation of the devices 1 to 4 of the invention except that the two luminescence layers and the intermediate layer were replaced by the following two luminescence layers and the intermediate layer.

First luminescence layer: On the hole transporting layer 4, charge transporting material A and the iridium complex 2 having the following structuer (T1 is 2.07 eV and the emission peak is 620 nm) were co-deposited such that the ratio of the iridium complex 2 to charge transporting material A became 10% by weight. The thickness was 10 nm.

Intermediate layer: On the first luminescence layer, the charge transporting material 2 (1,4-bis(triphenylsilyl)benzene) (T1 is 3.23 eV) was deposited to a thickness of 0.5 nm for the device 17 of the invention, to a thickness of 1.0 nm for the device 18 of the invention, to a thickness of 2.0 nm for the device 19 of the invention, and to a thickness of 5.0 nm for the device 20 of the invention.

Second luminescence layer: On the intermediate layer, charge transporting material 2, the platinum complex 3 and iridium complex 3 having the following structure (T1 is 2.52 eV and the emission peak is 517 nm) were co-deposited into a ternary codeposition such that the ratios of the platinum complex 3 and iridium complex 3

TABLE 2

| Device No. | Device Structure | | | | Performance | | |
| --- | --- | --- | --- | --- | --- | --- | --- |
| | Film thickness of first luminescence layer (nm) | Film thickness of second luminescence layer (nm) | Film thickness of third luminescence layer (nm) | Film thickness of intermediate layer (nm) | Drive voltage (V) | External quantum efficiency (%) | Brightness half-life time ratio |
| Device 9 | 20 | 10 | | 0.5 | 6.7 | 9.1 | 1.9 |
| Device 10 | 20 | 10 | | 1.0 | 6.6 | 9.9 | 2.4 |
| Device 11 | 20 | 10 | | 5.0 | 6.7 | 9.8 | 2.3 |
| Device 12 | 20 | 10 | | 10.0 | 6.8 | 9.2 | 2.1 |
| Device 13 | 20 | 5 | 5 | 0.5 | 5.8 | 10.1 | 1.8 |
| Device 14 | 20 | 5 | 5 | 1.0 | 5.6 | 10.5 | 2.2 |
| Device 15 | 20 | 5 | 5 | 5.0 | 5.7 | 9.9 | 1.9 |
| Device 16 | 20 | 5 | 5 | 10.0 | 5.8 | 9.8 | 1.7 |
| Comparative Device E1 | 20 | 10 | | | 7.0 | 9.0 | 1.0 |
| Comparative Device F1 | 20 | 5 | 5 | | 6.2 | 9.7 | 1 |
| Comparative Device G1 | 20 | 10 | | 0.5 | 7.2 | 8.8 | 1.1 |
| Comparative Device G2 | 20 | 10 | | 1.0 | 7.4 | 8.7 | 1.15 |
| Comparative Device G3 | 20 | 10 | | 5.0 | 7.7 | 8.5 | 1.1 |
| Comparative Device G4 | 20 | 10 | | 10.0 | 8.0 | 7.9 | 1.1 |
| Comparative Device H1 | 20 | 5 | 5 | 0.5 | 6.8 | 8.5 | 1.05 |
| Comparative Device H2 | 20 | 5 | 5 | 1.0 | 7.0 | 8.3 | 1.1 |
| Comparative Device H3 | 20 | 5 | 5 | 5.0 | 7.3 | 8.1 | 1.15 |
| Comparative Device H4 | 20 | 5 | 5 | 10.0 | 7.7 | 7.8 | 1.1 |

From the results in Table 2, the devices 9 to 16 using the charge transporting material 1 in the intermediate layer, as compared with the comparative devices E1 and F1 which did not contain intermediate layer and G1 to G4 and H1 to H4 using the charge transporting material A in the intermediate layer, had lower drive voltage and higher external quantum efficiency and were more excellent in drive durability. Particularly, the devices provided with the intermediate layer showed even more excellent performance in all of the drive voltage, the external quantum efficiency and the drive durability.

to charge transporting material 2 became 15% by weight and 0.5% by weight, respectively. The thickness was 20 nm.

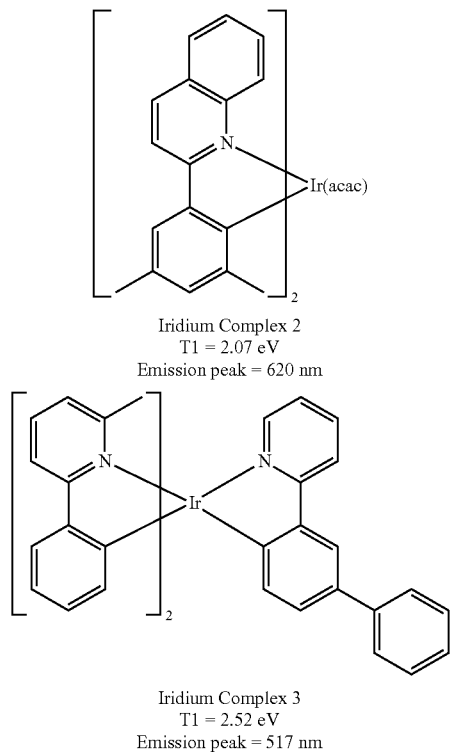

Iridium Complex 2
T1 = 2.07 eV
Emission peak = 620 nm

Iridium Complex 3
T1 = 2.52 eV
Emission peak = 517 nm

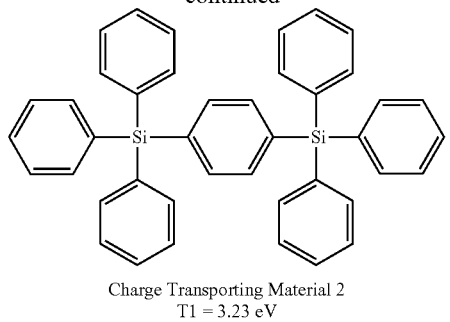

Charge Transporting Material 2
T1 = 3.23 eV (Preparation of Comparative Device I1)

Comparative device I1 was prepared in the same manner as in preparation of the device 17 of the invention except that the intermediate layer was not formed.

(Preparation of Comparative Devices J1 to J4)

Comparative devices J1 to J4 were prepared in the same manner as in preparation of the device 17 of the invention except that the charge transporting material 2 of the intermediate material was changed to the charge transporting material A, the material was deposited to a thickness of 0.5 nm in the comparative device J1, to a thickness of 1.0 nm in the comparative device J2, to a thickness of 2.0 nm in the comparative device J3, and to a thickness of 5.0 nm in the comparative device J4.

2. Evaluation of Performance

The devices of the invention and the comparative devices thus obtained were evaluated in the same manner as in Example 1. With respect to the evaluation of drive durability, the devices 17 to 20 of the invention and the comparative devices J1 to J4 were evaluated relative to the comparative device I1, which is assumed to have a brightness half-life time ratio of 1. The results are shown in Table 3.

TABLE 3

| | Device Structure | | | | | Performance | | |
| --- | --- | --- | --- | --- | --- | --- | --- | --- |
| Device No. | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
| Device 17 | 10 | 20 | | 0.5 | | 6.2 | 8.3 | 1.7 |
| Device 18 | 10 | 20 | | 1.0 | | 6.2 | 8.4 | 1.5 |
| Device 19 | 10 | 20 | | 2.0 | | 6.3 | 8.2 | 1.3 |
| Device 20 | 10 | 20 | | 5.0 | | 6.4 | 8.1 | 1.2 |
| Comparative Device I1 | 10 | 20 | | | | 6.8 | 8.0 | 1.0 |
| Comparative Device J1 | 10 | 20 | | 0.5 | | 6.9 | 8.0 | 1.1 |
| Comparative Device J2 | 10 | 20 | | 1.0 | | 6.8 | 8.1 | 1.1 |
| Comparative Device J3 | 10 | 20 | | 2.0 | | 6.8 | 8.1 | 1.2 |
| Comparative Device J4 | 10 | 20 | | 5.0 | | 6.8 | 7.6 | 1.2 |

From the results in Table 3, the devices 17 to 20 using the charge transporting material 2 in the intermediate layer, as compared with the comparative devices J1 to J4 using the charge transporting material A in the intermediate layer, had lower drive voltage and higher external quantum efficiency and were more excellent in drive durability. Particularly, the devices provided with the intermediate layer containing the charge transporting material 2 showed even more excellent performance in all of the drive voltage, the external quantum efficiency and the drive durability compare to the comparative device I1 not having an intermediate layer.

The charge transporting material A has a T1 value of 2.86 eV while the platinum complex 3 in the luminescence layer has a T1 value of 2.74 eV, and thus the difference therebetween is as small as 0.12 eV and is thus estimated to fail to attain the effect of the invention.

The charge transporting material 2 has a T1 value of 3.23 eV which is higher by 0.49 eV than that of the platinum complex 3 having a shortest wavelength emission among the phosphorescence materials contained in the luminescence layer and is thus estimated to contribute to the effect of the invention.

Example 4

1. Preparation of Organic EL Devices
(Preparation of Devices 21 to 24 of the Invention)
The devices 21 to 24 of the invention were prepared in the same manner as in preparation of the devices 1 to 4 of the invention except that the two luminescence layers and the intermediate layer were replaced by the following two luminescence layers and the intermediate layer.

First luminescence layer: On the hole transporting layer 4, charge transporting material A, the iridium complex 3 and iridium complex 2 were co-deposited into a ternary codeposition such that the ratios of the iridium complex 3 and iridium complex 2 to charge transporting material A became 10% by weight and 0.5% by weight, respectively. The thickness was 10 nm.

Intermediate layer: On the first luminescence layer, the charge transporting material 2 was deposited to a thickness of 0.5 nm for the device 21 of the invention, to a thickness of 1.0 nm for the device 22 of the invention, to a thickness of 2.0 nm for the device 23 of the invention, and to a thickness of 5.0 nm for the device 24 of the invention.

Second luminescence layer: On the intermediate layer, charge transporting material 2 and the iridium complex 4 having the following structure (T1 is 2.76 eV and the emission peak is 463 nm) were co-deposited such that the ratio of the iridium complex 4 to charge transporting material 2 became 10% by weight. The thickness was 20 nm.

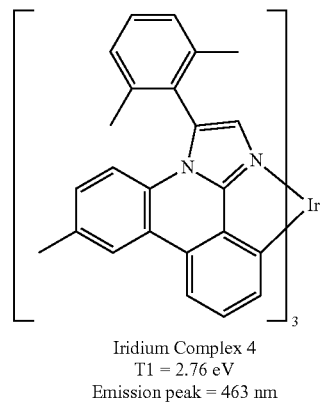

Iridium Complex 4
T1 = 2.76 eV
Emission peak = 463 nm (Preparation of Comparative Device K1)
Comparative device K1 was prepared in the same manner as in preparation of the device 21 of the invention except that the intermediate layer was not formed.

(Preparation of Comparative Devices L1 to L4)
Comparative devices L1 to L4 were prepared in the same manner as in preparation of the device 21 of the invention except that the charge transporting material 2 of the intermediate material was changed to the charge transporting material A, the material was deposited to a thickness of 0.5 nm in the comparative device L1, to a thickness of 1.0 nm in the comparative device L2, to a thickness of 2.0 nm in the comparative device L3, and to a thickness of 5.0 nm in the comparative device L4.

2. Evaluation of Performance
The devices of the invention and the comparative devices thus obtained were evaluated in the same manner as in Example 1. With respect to the evaluation of drive durability, the devices 21 to 24 of the invention and the comparative devices L1 to L4 were evaluated relative to the comparative device K1, which is assumed to have a brightness half-life time ratio of 1. The results are shown in Table 4.

TABLE 4

| | Device Structure | | | | | Performance | | |
| | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
| Device No. | | | | | | | | |
|---|---|---|---|---|---|---|---|---|
| Device 21 | 10 | 20 | | 0.5 | | 7.1 | 8.2 | 1.4 |
| Device 22 | 10 | 20 | | 1.0 | | 7.2 | 8.3 | 1.5 |
| Device 23 | 10 | 20 | | 2.0 | | 7.3 | 8.1 | 1.3 |
| Device 24 | 10 | 20 | | 5.0 | | 7.4 | 7.7 | 1.2 |
| Comparative Device K1 | 10 | 20 | | | | 7.5 | 7.6 | 1.0 |
| Comparative Device L1 | 10 | 20 | | 0.5 | | 7.4 | 7.8 | 1.1 |
| Comparative Device L2 | 10 | 20 | | 1.0 | | 7.5 | 8.0 | 1.1 |
| Comparative Device L3 | 10 | 20 | | 2.0 | | 7.6 | 7.7 | 1.2 |

TABLE 4-continued

| | Device Structure | | | | | Performance | | |
|---|---|---|---|---|---|---|---|---|
| Device No. | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
| Comparative Device L4 | 10 | 20 | | 5.0 | | 7.6 | 7.6 | 1.3 |

From the results in Table 4, the devices 21 to 24 using the charge transporting material 2 in the intermediate layer, as compared with the comparative devices L1 to L4 using the charge transporting material A in the intermediate layer, had lower drive voltage and higher external quantum efficiency and were more excellent in drive durability. Particularly, the devices provided with the intermediate layer containing the charge transporting material 2 showed even more excellent performance in all of the drive voltage, the external quantum efficiency and the drive durability compare to the comparative device K1 not having an intermediate layer.

The charge transporting material A has a T1 value of 2.86 eV while the iridium complex 4 having the shortest wavelength emission among the phosphorescence materials contained in the luminescence layers has a T1 value of 2.76 eV, and thus the difference therebetween is as small as 0.10 eV and is thus estimated to fail to attain the effect of the invention.

The charge transporting material 2 has a T1 value of 3.23 eV which is higher by 0.47 eV than that of the iridium complex 4 having a shortest wavelength emission among the phosphorescence materials contained in the luminescence layers and is thus estimated to contribute to the effect of the invention.

Example 5

1. Preparation of Organic EL Devices
(Preparation of Devices 25 to 28 of the Invention)
The devices 25 to 28 of the invention were prepared in the same manner as in preparation of the devices 1 to 4 of the invention except that the two luminescence layers and the intermediate layer were replaced by the following two luminescence layers and the intermediate layer.
First luminescence layer: On the hole transporting layer 4, charge transporting material 2 and the iridium complex 3 were co-deposited such that the ratio of the iridium complex 3 to charge transporting material 2 became 10% by weight. The thickness was 10 nm.
Intermediate layer: On the first luminescence layer, the charge transporting material 2 was deposited to a thickness of 0.5 nm for the device 25 of the invention, to a thickness of 1.0 nm for the device 26 of the invention, to a thickness of 2.0 nm for the device 27 of the invention, and to a thickness of 5.0 nm for the device 28 of the invention.
Second luminescence layer: On the intermediate layer, charge transporting material A, the platinum complex 3 and iridium complex 2 were co-deposited into a ternary codeposition such that the ratios of the platinum complex 3 and iridium complex 2 to charge transporting material A became 15% by weight and 0.5% by weight, respectively. The thickness was 20 nm.
(Preparation of Comparative Device M1)
Comparative device M1 was prepared in the same manner as in preparation of the device 25 of the invention except that the intermediate layer was not formed.
(Preparation of Comparative Devices N1 to N4)
Comparative devices N1 to N4 were prepared in the same manner as in preparation of the device 25 of the invention except that the charge transporting material 2 of the intermediate material was changed to the charge transporting material A, the material was deposited to a thickness of 0.5 nm in the comparative device N1, to a thickness of 1.0 nm in the comparative device N2, to a thickness of 2.0 nm in the comparative device N3, and to a thickness of 5.0 nm in the comparative device N4.
2. Evaluation of Performance
The devices of the invention and the comparative devices thus obtained were evaluated in the same manner as in Example 1. With respect to the evaluation of drive durability, the devices 25 to 28 of the invention and the comparative devices N1 to N4 were evaluated relative to the comparative device M1, which is assumed to have a brightness half-life time ratio of 1. The results are shown in Table 5.

TABLE 5

| | Device Structure | | | | | Performance | | |
|---|---|---|---|---|---|---|---|---|
| Device No. | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
| Device 25 | 10 | 20 | | 0.5 | | 5.8 | 8.9 | 1.6 |
| Device 26 | 10 | 20 | | 1.0 | | 5.7 | 9.0 | 1.4 |
| Device 27 | 10 | 20 | | 2.0 | | 5.7 | 8.8 | 1.2 |
| Device 28 | 10 | 20 | | 5.0 | | 5.9 | 8.6 | 1.2 |
| Comparative Device M1 | 10 | 20 | | | | 6.4 | 8.5 | 1.0 |
| Comparative Device N1 | 10 | 20 | | 0.5 | | 6.1 | 8.2 | 1.1 |

TABLE 5-continued

| Device No. | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
|---|---|---|---|---|---|---|---|---|
| Comparative Device N2 | 10 | 20 | | 1.0 | | 6.1 | 8.3 | 1.1 |
| Comparative Device N3 | 10 | 20 | | 2.0 | | 6.3 | 8.3 | 1.2 |
| Comparative Device N4 | 10 | 20 | | 5.0 | | 6.4 | 8.4 | 1.2 |

From the results in Table 5, the devices 25 to 28 using the charge transporting material 2 in the intermediate layer, as compared with the comparative devices N1 to N4 using the charge transporting material A in the intermediate layer, had lower drive voltage and higher external quantum efficiency and were more excellent in drive durability. Particularly, the devices provided with the intermediate layer containing the charge transporting material 2 showed even more excellent performance in all of the drive voltage, the external quantum efficiency and the drive durability compare to the comparative device K1 not having an intermediate layer.

The charge transporting material A has a T1 value of 2.86 eV while the platinum complex 3 in the luminescence layer has a T1 value of 2.74 eV, and thus the difference therebetween is as small as 0.12 eV and is thus estimated to fail to attain the effect of the invention.

The charge transporting material 2 has a T1 value of 3.23 eV which is higher by 0.49 eV than that of the platinum complex 3 having a shortest wavelength emission among the phosphorescence materials contained in the luminescence layer and is thus estimated to contribute to the effect of the invention.

Example 6

1. Preparation of Organic EL devices
(Preparation of Devices 29 to 32 of the Invention)

The devices 29 to 32 of the invention were prepared in the same manner as in preparation of the devices 1 to 4 of the invention except that the two luminescence layers and the intermediate layer were replaced by the following three luminescence layers and two intermediate layers.

First luminescence layer: On the hole transporting layer 4, charge transporting material A and the iridium complex 2 were co-deposited such that the ratio of the iridium complex 2 to charge transporting material A became 5% by weight. The thickness was 5 nm.

First intermediate layer: On the first luminescence layer, the charge transporting material 2 was deposited to a thickness of 0.5 nm for the device 29 of the invention, to a thickness of 1.0 nm for the device 30 of the invention, to a thickness of 2.0 nm for the device 31 of the invention, and to a thickness of 5.0 nm for the device 32 of the invention.

Second luminescence layer: On the first intermediate layer, charge transporting material 2 and the iridium complex 4 were co-deposited such that the ratio of the iridium complex 4 to charge transporting material 2 became 10% by weight. The thickness was 20 nm.

Second intermediate layer: On the second luminescence layer, the charge transporting material 2 was deposited to a thickness of 3.0 nm for the devices 29 to 32 of the invention.

Third luminescence layer: On the second intermediate layer, charge transporting material 2 and the iridium complex 3 were co-deposited such that the ratio of the iridium complex 3 to charge transporting material 2 became 10% by weight. The thickness was 5 nm.

(Preparation of Comparative Device O1)

Comparative device O1 was prepared in the same manner as in preparation of the device 29 of the invention except that the intermediate layer was not formed.

(Preparation of Comparative Devices P1 to P4)

Comparative devices P1 to P4 were prepared in the same manner as in preparation of the device 29 of the invention except that the charge transporting material 2 of the intermediate material was changed to the charge transporting material A, the material was deposited to a thickness of 3.0 nm in the comparative devices P1 to P4.

2. Evaluation of Performance

The devices of the invention and the comparative devices thus obtained were evaluated in the same manner as in Example 1. With respect to the evaluation of drive durability, the devices 29 to 32 of the invention and the comparative devices P1 to P4 were evaluated relative to the comparative device O1, which is assumed to have a brightness half-life time ratio of 1. The results are shown in Table 6.

TABLE 6

| Device No. | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
|---|---|---|---|---|---|---|---|---|
| Device 29 | 5 | 20 | 5 | 0.5 | 3 | 8.2 | 8.2 | 2.0 |
| Device 30 | 5 | 20 | 5 | 1.0 | 3 | 8.3 | 8.3 | 1.8 |

TABLE 6-continued

| Device No. | Device Structure | | | | | Performance | | |
|---|---|---|---|---|---|---|---|---|
| | Film thickness of first luminescence layer (nm) | Film thickness of second luminescence layer (nm) | Film thickness of third luminescence layer (nm) | Film thickness of intermediate layer 1 (nm) | Film thickness of intermediate layer 2 (nm) | Drive voltage (V) | External quantum efficiency (%) | Brightness half-life time ratio |
| Device 31 | 5 | 20 | 5 | 2.0 | 3 | 8.4 | 8.1 | 1.5 |
| Device 32 | 5 | 20 | 5 | 5.0 | 3 | 8.5 | 7.7 | 1.3 |
| Comparative Device O1 | 5 | 20 | 5 | | | 9.0 | 7.0 | 1.0 |
| Comparative Device P1 | 5 | 20 | 5 | 0.5 | 3 | 8.8 | 7.8 | 1.2 |
| Comparative Device P2 | 5 | 20 | 5 | 1.0 | 3 | 8.7 | 8.0 | 1.2 |
| Comparative Device P3 | 5 | 20 | 5 | 2.0 | 3 | 8.7 | 7.7 | 1.2 |
| Comparative Device P4 | 5 | 20 | 5 | 5.0 | 3 | 8.6 | 7.6 | 1.2 |

From the results in Table 6, the devices 29 to 32 using the charge transporting material 2 in the intermediate layer, as compared with the comparative devices P1 to P4 using the charge transporting material A in the intermediate layer, had lower drive voltage and higher external quantum efficiency and were more excellent in drive durability. Particularly, the devices provided with the intermediate layer containing the charge transporting material 2 showed even more excellent performance in all of the drive voltage, the external quantum efficiency and the drive durability compare to the comparative device K1 not having an intermediate layer.

The charge transporting material A has a T1 value of 2.86 eV while the iridium complex 4 having the shortest wavelength emission among the phosphorescence materials contained in the luminescence layers has a T1 value of 2.76 eV, and thus the difference therebetween is as small as 0.10 eV and is thus estimated to fail to attain the effect of the invention.

The charge transporting material 2 has a T1 value of 3.23 eV which is higher by 0.47 eV than that of the iridium complex 4 having a shortest wavelength emission among the phosphorescence materials contained in the luminescence layers and is thus estimated to contribute to the effect of the invention.

According to the invention, there is provided an organic electroluminescence device having low driving potential and high luminous efficiency. Particularly, an organic electroluminescence device useful as a white emission device is provided.

The organic EL device of the invention is an organic electroluminescence device having two or more luminescence layers, wherein an intermediate layer containing a charge transporting material having a high T1 value is arranged between the luminescence layers. As a result of the intermediate layer, excitons generated in a layer containing a phosphorescence material having high lowest excited triplet state energy are prevented from diffusing into another luminescence layer containing a phosphorescence material having low lowest excited triplet state energy. In addition, the intermediate layer does not block the charge transfer because it contains a charge transporting material. Accordingly, the excitons generated in each of the luminescence layers are enclosed in the same layer and can emit light effectively in the same layer, thus improving luminous efficiency. The intermediate layer in the invention does not block charge transfer and can function with a thin thickness, and thus can keep drive durability high without increasing the drive voltage.

What is claimed is:

1. An organic electroluminescence device comprising a pair of electrodes on a substrate, two or more luminescence layers disposed between the electrodes, and an intermediate layer containing a charge transporting material and disposed between the two or more luminescence layers, wherein:
   each of the two or more luminescence layers contains at least one phosphorescence material selected from a blue phosphorescence material having an emission peak from 420 nm to less than 500 nm, a green phosphorescence material having an emission peak from 500 nm to less than 570 nm, and a red phosphorescence material having an emission peak from 570 nm to 650 nm, the phosphorescence material contained in the respective luminescence layers having different emission peaks from one another;
   the charge transporting material contained in the intermediate layer has an energy difference (T1) of 2.7 eV or more between a ground state and an excited triplet state and the energy difference (T1) of the charge transporting material is higher by at least 0.15 eV than T1 of a phosphorescence material having the shortest wavelength emission among the phosphorescence materials contained in the two or more luminescence layers;
   the two or more luminescence layers comprise a layer containing the blue phosphorescence material and a layer containing the green phosphorescence material and the red phosphorescence material; and
   each of the two or more luminescence layers further contains a host material wherein the host material is different from the charge transporting material contained in the intermediate layer.

2. The organic electroluminescence device of claim 1, wherein the intermediate layer is 0.1 to 10 nm in layer thickness.

3. The organic electroluminescence device of claim 1, wherein the two or more luminescence layers comprise, in this order from an anode side, a layer containing a hole transporting host material having an ionization potential (Ip) of from 5.1 to 6.4 eV and an electron affinity (Ea) of from 1.2 to 3.1 eV and a layer containing an electron transporting host material having an ionization potential (Ip) of from 5.7 to 7.5 eV and an electron affinity (Ea) of from 2.5 to 3.5 eV.

4. The organic electroluminescence device of claim 1, wherein the two or more luminescence layers comprise, in this order from an anode side, a layer containing a hole transporting host material having an ionization potential (Ip) of from 5.1 to 6.4 eV and an electron affinity (Ea) of from 1.2 to 3.1 eV and a layer containing an electron transporting luminescence material having an ionization potential (Ip) of from 5.7 to 7.0 eV and an electron affinity (Ea) of from 2.5 to 3.5 eV.

5. The organic electroluminescence device of claim 1, wherein the blue phosphorescence material is contained in an amount of 10 to 25 mass % in the two or more luminescence layers, and the red phosphorescence material is contained in an amount of 0.2 to 5% by weight in the two or more luminescence layers.

* * * * *